United States Patent
Brunner et al.

(10) Patent No.: US 12,549,154 B2
(45) Date of Patent: Feb. 10, 2026

(54) PACKAGE COMPRISING AN ACOUSTIC DEVICE AND A CAP SUBSTRATE COMPRISING AN INDUCTOR

(71) Applicant: RF360 Singapore Pte. Ltd., Singapore (SG)

(72) Inventors: Sebastian Brunner, Graz (AT); Peter Hagn, Bavaria (DE); Stefan Leopold Hatzl, Kloech (AT); Manuel Hofer, Graz (AT); Horst Uwe Faulhaber, Tobelbad (AT); Kurt Wiesbauer, Deutschlandsberg (AT); Florian Rak, Krottendorf-Gaisfeld (AT); Roman Kravchenko, Graz (AT)

(73) Assignee: RF360 Singapore Pte. Ltd., Singapore (SG)

( * ) Notice: Subject to any disclaimer, the term of this patent is extended or adjusted under 35 U.S.C. 154(b) by 593 days.

(21) Appl. No.: 17/485,270

(22) Filed: Sep. 24, 2021

(65) Prior Publication Data
US 2023/0101228 A1 Mar. 30, 2023

(51) Int. Cl.
*H03H 9/17* (2006.01)
*H03H 9/05* (2006.01)
*H03H 9/56* (2006.01)

(52) U.S. Cl.
CPC .............. *H03H 9/17* (2013.01); *H03H 9/05* (2013.01); *H03H 9/56* (2013.01)

(58) Field of Classification Search
CPC .. H03H 9/02; H03H 9/05; H03H 9/15; H03H 9/17; H03H 9/56
See application file for complete search history.

(56) References Cited

U.S. PATENT DOCUMENTS

| | | | |
|---|---|---|---|
| 7,378,724 B2 | 5/2008 | Yu et al. | |
| 7,417,525 B2* | 8/2008 | Lee | H01L 27/08 336/200 |
| 9,397,116 B2 | 7/2016 | Huang et al. | |
| 10,069,474 B2 | 9/2018 | Yun et al. | |
| 10,582,609 B2* | 3/2020 | Yun | H05K 3/32 |
| 10,680,159 B2* | 6/2020 | Metzger | B81B 7/02 |
| 10,819,309 B1 | 10/2020 | Turner et al. | |
| 11,088,090 B1 | 8/2021 | Brunner et al. | |
| 11,159,141 B2* | 10/2021 | Yamamoto | H03H 9/02834 |

(Continued)

FOREIGN PATENT DOCUMENTS

CN 112290901 A 1/2021

OTHER PUBLICATIONS

International Search Report and Written Opinion—PCT/US2023/073534—ISA/EPO—Jan. 10, 2024.

(Continued)

*Primary Examiner* — Andrea Lindgren Baltzell
*Assistant Examiner* — Alan Wong
(74) *Attorney, Agent, or Firm* — Loza & Loza, LLP

(57) ABSTRACT

A package that includes an acoustic device, a frame coupled to the acoustic device and a cap substrate coupled to the acoustic device through the frame. The acoustic device includes a substrate and an acoustic element coupled to the substrate. The cap substrate includes an inductor. The cap substrate is configured as a cap for the acoustic device. The package includes a cavity located between the acoustic device and the cap substrate. The frame may include a polymer frame.

19 Claims, 21 Drawing Sheets

*CROSS SECTIONAL SIDE PROFILE VIEW*

(56) References Cited

U.S. PATENT DOCUMENTS

| | | |
|---|---|---|
| 11,201,127 B2 | 12/2021 | Kim et al. |
| 11,244,906 B2 | 2/2022 | Huang et al. |
| 11,437,563 B2* | 9/2022 | Park .................. H10N 30/20 |
| 11,581,870 B2* | 2/2023 | Takano ................ H03H 9/25 |
| 2007/0085648 A1* | 4/2007 | Lee ..................... H01L 27/08 |
| | | 336/200 |
| 2010/0134210 A1 | 6/2010 | Umeda |
| 2011/0090651 A1 | 4/2011 | Jung et al. |
| 2011/0214265 A1* | 9/2011 | Tsuda ................ H03H 9/1085 |
| | | 29/25.35 |
| 2012/0094418 A1 | 4/2012 | Grama et al. |
| 2013/0337610 A1 | 12/2013 | Oda et al. |
| 2016/0343646 A1 | 11/2016 | Alvarado et al. |
| 2019/0019939 A1* | 1/2019 | Park .................. H10N 30/20 |
| 2019/0132942 A1 | 5/2019 | Yun et al. |
| 2020/0035654 A1 | 1/2020 | Chen et al. |
| 2020/0144985 A1 | 5/2020 | Bulger |
| 2021/0035929 A1 | 2/2021 | Park et al. |
| 2021/0099149 A1 | 4/2021 | Lan et al. |
| 2021/0280507 A1 | 9/2021 | Aldrete et al. |
| 2021/0375707 A1 | 12/2021 | Teixeira De Queiros et al. |
| 2021/0376810 A1 | 12/2021 | Kim et al. |
| 2021/0376816 A1 | 12/2021 | Bywalez et al. |
| 2022/0246496 A1 | 8/2022 | We et al. |
| 2024/0097648 A1 | 3/2024 | Brunner et al. |

OTHER PUBLICATIONS

International Search Report and Written Opinion—PCT/EP2022/073811—ISA/EPO—Jan. 4, 2023.

Wang Z., "3-D Integration and Through-Silicon Vias in MEMS and Microsensors", Journal of Microelectromechanical Systems, Oct. 1, 2015, vol. 24, No. 5, XP055405155, ISSN: 1957-7157, DOI: 10.1109/JMEMS.2015.2448681, pp. 1211-1244, Section V.C., figures 11,15,23,27,43.

* cited by examiner

*CROSS SECTIONAL SIDE PROFILE VIEW*

CROSS SECTIONAL SIDE PROFILE VIEW

CROSS SECTIONAL SIDE PROFILE VIEW

CROSS SECTIONAL SIDE PROFILE VIEW

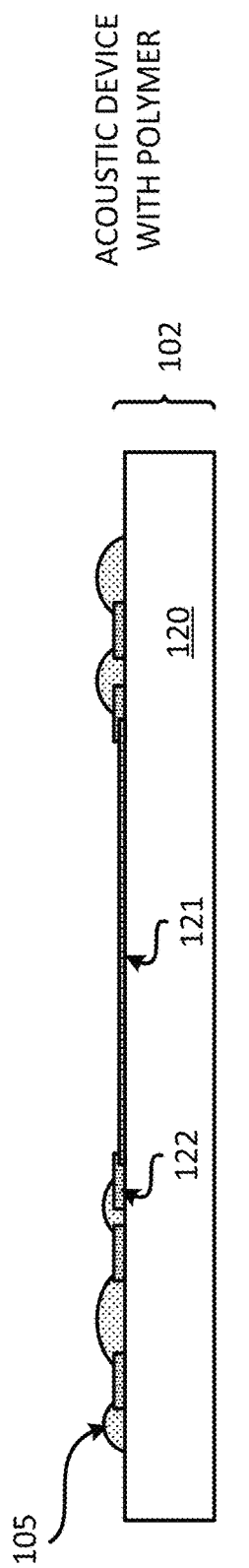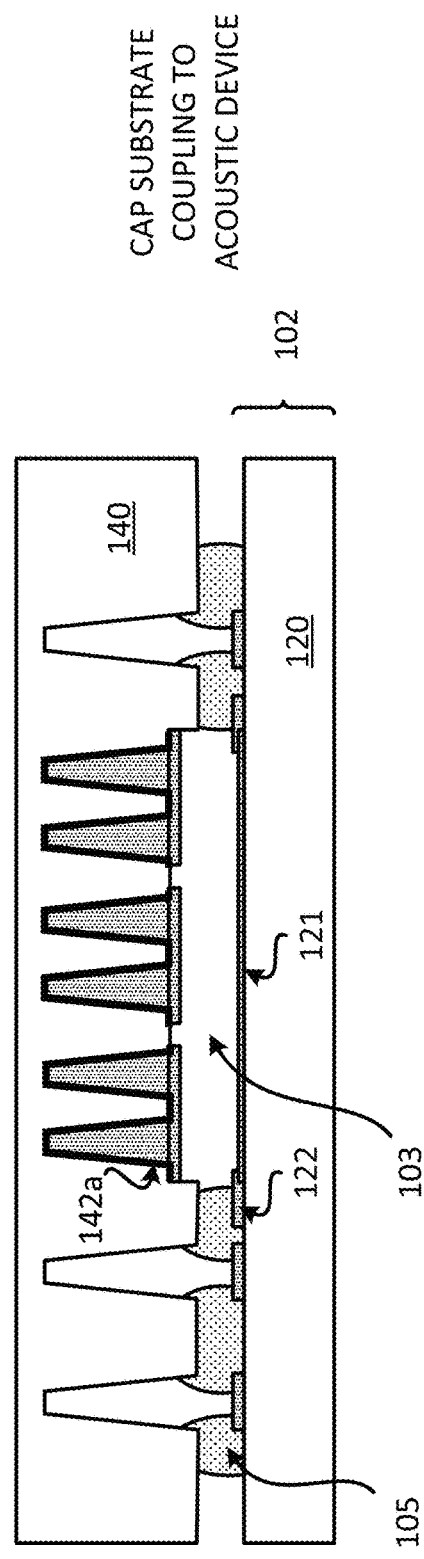
FIG. 11C

PACKAGE COMPRISING AN ACOUSTIC DEVICE AND A CAP SUBSTRATE COMPRISING AN INDUCTOR

FIELD

Various features relate to a package that includes an acoustic device.

BACKGROUND

Acoustic devices may be used for filtering out unwanted signals. For example, an acoustic device may be used to filter out signals at various frequencies, while letting through signals at a certain frequency. These acoustic devices may be implemented in a package, which may in turn be implemented in a device. As the devices have gotten smaller and smaller, there is an ongoing need to provide packages with acoustic devices with better form factors and smaller sizes.

SUMMARY

Various features relate to a package that includes an acoustic device.

One example provides a package that includes an acoustic device, a cap substrate coupled to the acoustic device, and a frame. The acoustic device includes a substrate and an acoustic element coupled to the substrate. The cap substrate is coupled to the acoustic device through the frame. The cap substrate includes an inductor. The cap substrate is configured as a cap for the acoustic device. The package includes a cavity located between the acoustic device and the cap substrate.

Another example provides a package that includes an acoustic device, a polymer frame coupled to the acoustic device and a cap substrate coupled to the acoustic device through the polymer frame. The acoustic device includes a substrate and an acoustic element coupled to the substrate. The cap substrate includes an inductor. The cap substrate is configured as a cap for the acoustic device. The package includes a cavity located between the acoustic device and the cap substrate.

Another example provides package comprising that includes an acoustic device and a cap substrate coupled to the acoustic device. The acoustic device includes a substrate and an acoustic element coupled to the substrate. The cap substrate is coupled to the acoustic device through a first plurality of interconnects and a second plurality of interconnects. The cap substrate includes an inductor. The cap substrate is configured as a cap for the acoustic device. The package includes a cavity located between the acoustic device and the cap substrate.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 11A-11F illustrate an exemplary sequence for fabricating a package comprising an acoustic device and a passive device configured as cap for the acoustic device.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes an acoustic device and a cap substrate coupled to the acoustic device. The package may include a polymer frame. The acoustic device may be coupled to the cap substrate through the polymer frame. In some implementations, the acoustic device may be coupled to the cap substrate through one or more metal frame. The one or more metal frame may include a plurality of interconnects that includes copper and a plurality of interconnects that includes tin (or gold tin (AuSn)). The acoustic device includes a substrate and an acoustic element coupled to the substrate. The cap substrate includes an inductor. The cap substrate is configured as a cap for the acoustic device. The package includes a cavity located between the acoustic device and the cap substrate. The cap substrate and the inductor may be part of a passive device coupled to the acoustic device through the polymer frame. A metallization portion may be coupled to the cap substrate. The configuration of the package provides a package with a smaller footprint and a more compact form factor. For example, stacking the cap substrate (which includes an inductor) over the acoustic device may reduce the footprint and/or lateral size of the package, while still providing a relatively thin package.

Figure 1:
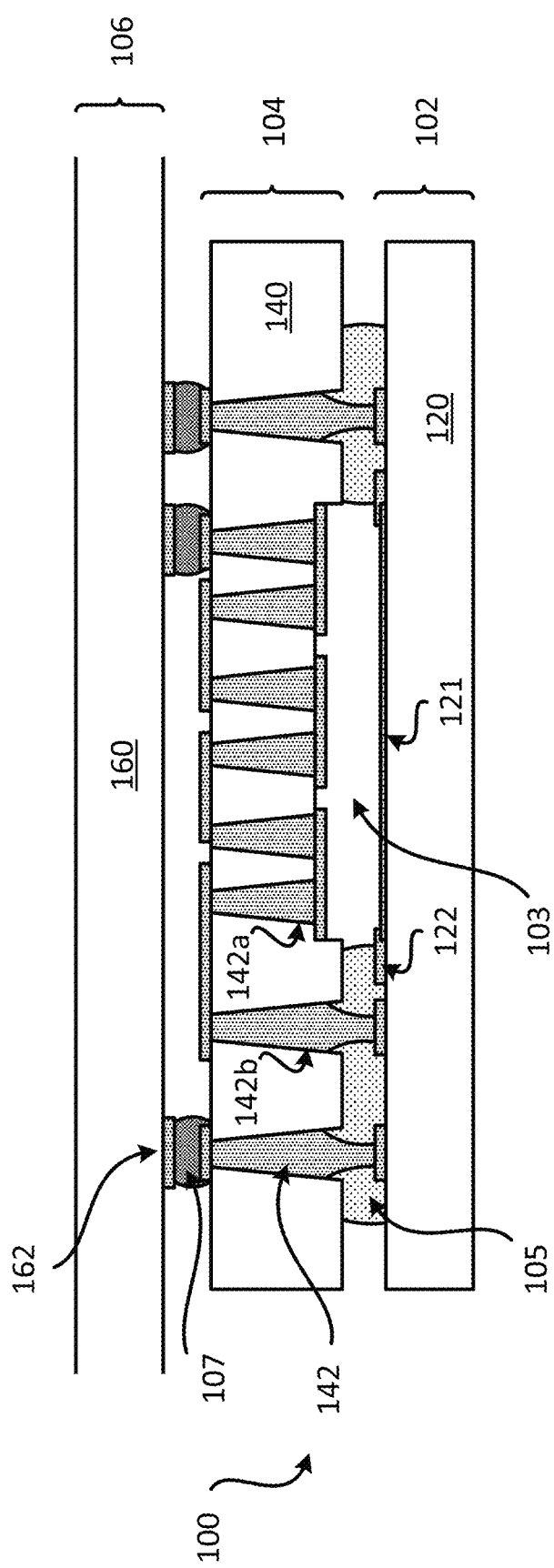
FIG. 1 illustrates a cross sectional profile view of an exemplary package comprising an acoustic device and a passive device configured as cap for the acoustic device.

Exemplary Package Comprising an Acoustic Device and a Cap Substrate Comprising an Inductor FIG. 1 illustrates a cross sectional profile view of a package 100 that includes an acoustic device and a cap substrate comprising an inductor. The package 100 is coupled to a board 106 through a plurality of solder interconnects 107. The package 100 and the board 106 may be part of an assembly.

The package 100 includes an acoustic device 102, a passive device 104 and a polymer frame 105. The polymer frame 105 is coupled to the acoustic device 102 and the passive device 104. The passive device 104 is coupled to the acoustic device 102 through the polymer frame 105. The passive device 104 is coupled to the board 106 through the plurality of solder interconnects 107. The package 100 includes a cavity 103 that is located between the acoustic device 102 and the passive device 104. The cavity 103 may be defined by at least the acoustic device 102, the passive device 104 and the polymer frame 105.

The acoustic device 102 includes a substrate 120, an acoustic element 121 and a plurality of interconnects 122. The plurality of interconnects 122 may be coupled to the acoustic element 121. The substrate 120 may include a piezoelectric substrate. The substrate 120 may include a piezoelectric material. In some implementations, the substrate 120 may be entirely a piezoelectric material. In some implementations, a piezoelectric material may be formed over a surface of the substrate 120. The plurality of interconnects 122 is coupled to the acoustic element 121. An example of an acoustic element includes a transducer. The acoustic device 102 may be configured to operate as a filter (e.g., RF filter). For example, the acoustic element 121 (e.g., transducer) of the acoustic device 102 may be configured to operate as a filter. The acoustic device 102 may be configured to operate as a surface acoustic wave (SAW) filter or a bulk acoustic wave (BAW) filter. More specific examples of an acoustic device and/or a filter device is further described below in at least FIGS. 6 and 7.

The passive device 104 includes a cap substrate 140 and a plurality of interconnects 142. The plurality of interconnects 142 may be located in the cap substrate 140, over a first surface of the cap substrate 140, and over a second surface of the cap substrate 140. The plurality of interconnects 142 may include a plurality of interconnects 142a that is configured to operate as an inductor. The inductor may include a solenoid inductor. An example of how the plurality of interconnects 142a of a cap substrate 140 may be configured as an inductor is further described below in at least FIG. 5. The passive device 104 is located between the acoustic device 102 and the board 106. The passive device 104 may be configured as a cap for the acoustic device 102. The cap substrate 140 may be configured as a cap for the acoustic element 121 of the acoustic device 102. The inductor (which is defined by the plurality of interconnects 142a) may be configured as a cap for the acoustic element 121 of the acoustic device 102.

The inductor implemented in the cap substrate 140 may be configured to be electrically coupled to the acoustic device 102. For example, the inductor implemented in the cap substrate 140 may be configured to be electrically coupled to the acoustic element 121. The passive device 104 is coupled to the acoustic device 102 such that the cavity 103 is located between the passive device 104 and the acoustic device 102. The cavity 103 may be located between the acoustic element 121 and the cap substrate 140. For example, the cavity 103 may be located between the acoustic element 121 of the acoustic device 102 and the inductor (which may be defined by the plurality of interconnects 142a) of the passive device 104. A cavity may be at least one region that is free of a solid material. A cavity may be occupied by a gas (e.g., air). The cavity 103 may be located over the acoustic element 121. The polymer frame 105 may laterally surround the cavity 103. The cavity 103 may be located over the acoustic element 121. The polymer frame 105 may laterally surround the cavity 103. The cavity 103 may include a cavity in the cap substrate 140. An example of a cavity (e.g., 510) that may be part of the cavity 103 is further described in FIG. 5 below.

The plurality of interconnects 142 may also include a plurality of interconnects 142b. The plurality of interconnects 142b may extend through the thickness of the cap substrate 140. The plurality of interconnects 142b may be coupled to the plurality of interconnects 122. Part of the plurality of interconnects 142b may be located between the polymer frame 105. The plurality of interconnects 142b may include cavity interconnects (e.g., cavity interconnect vias).

The package 100 is coupled to the board 106 through the plurality of solder interconnects 107. The board 106 may include a printed circuit board (PCB). The board 106 may include at least one dielectric layer 160 and a plurality of board interconnects 162. The plurality of solder interconnects 107 is coupled to the plurality of board interconnects 162 and interconnects from the plurality of interconnects 142.

In some implementations, one or more electrical signals may travel through the inductor (e.g., defined by interconnects 142a), interconnects 142 of the cap substrate 140, and/or interconnects 122 from the acoustic device 102. For example, an electrical signal may travel through the interconnect 142b to and/or from the interconnects 122. In some implementations, additional layers of materials may be added to provide a more robust and crack resistant package.

Figure 2:
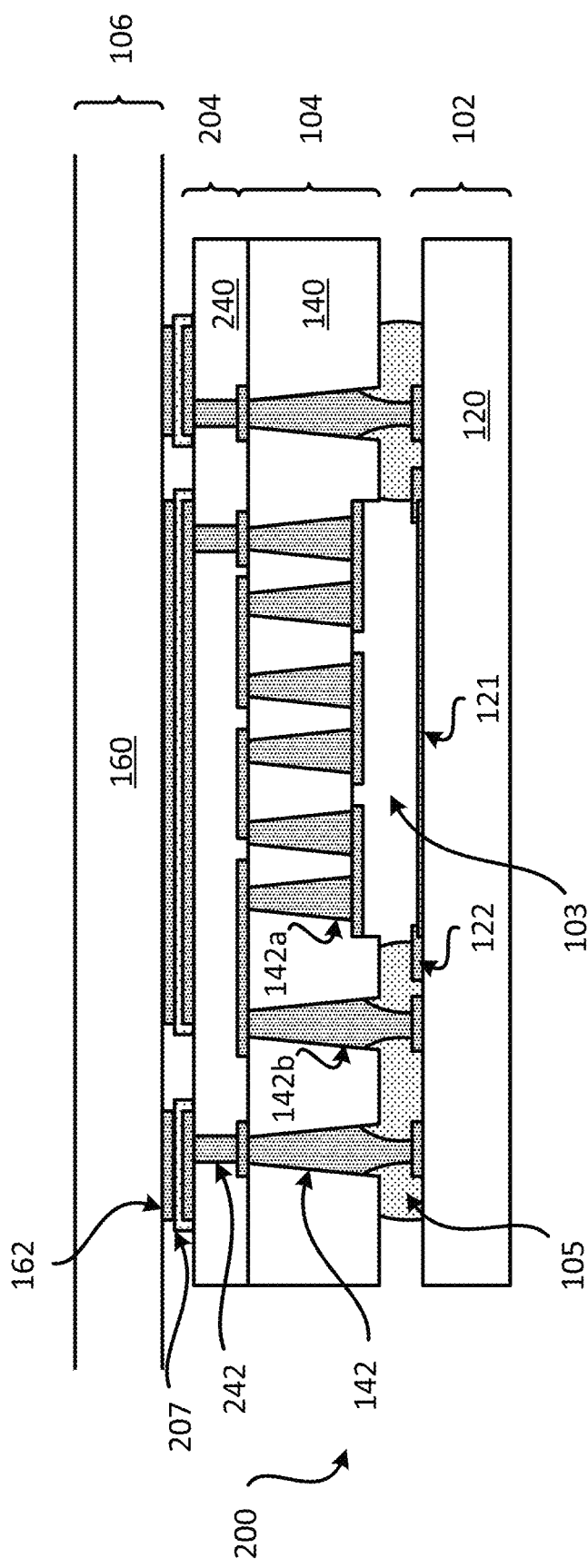
FIG. 2 illustrates a cross sectional profile view of another exemplary package comprising an acoustic device, a passive device configured as cap for the acoustic device and a redistribution layer.

FIG. 2 illustrates a package 200 that includes an additional metallization portion and/or a metallization layer. The package 200 is similar to the package 100, and includes similar components configured in a similar manner as described for the package 100. The package 200 includes the acoustic device 102, the polymer frame 105, the passive device 104, the cavity 103 and the metallization portion 204. The passive device 104 is coupled to the acoustic device 102 through the polymer frame 205. The metallization portion 204 is coupled to a surface of the passive device 104. The metallization portion 204 may be a redistribution portion and/or a stress buffer portion. The metallization portion 204 includes at least one dielectric layer 240 and a plurality of interconnects 242. The dielectric layer 240 may include prepreg and/or polyimide. The plurality of interconnects 242 may be coupled to the plurality of interconnects 142. The plurality of interconnects 242 may be coupled to the inductor of the cap substrate 140. For example, the plurality of interconnects 242 may be coupled to the plurality of interconnects 142a. The plurality of interconnects 242 may include a plurality of metallization interconnects. The plurality of interconnects 242 may include a plurality of redistribution interconnects.

The package 200 is coupled to the board 106 through the plurality of interconnects 207. The plurality of interconnects 207 may be coupled to the plurality of board interconnects 162 and the plurality of interconnects 242 of the metallization portion 204. The plurality of interconnects 207 may include a land grid array (LGA). The plurality of interconnects 207 may include a metal layer. The metallization portion 204 is located between the passive device 104 and the board 106.

Figure 3:
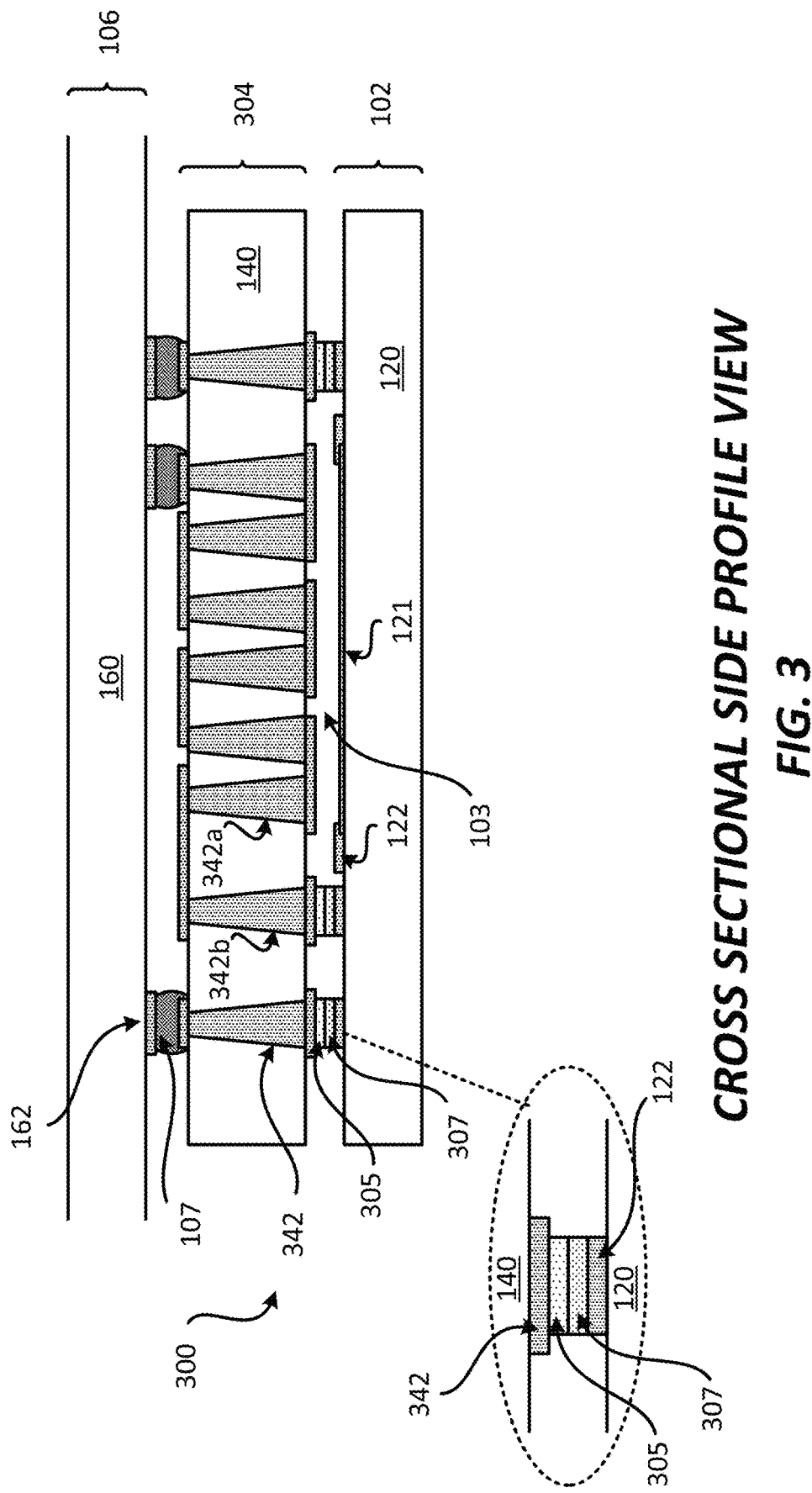
FIG. 3 illustrates a cross sectional profile view of an exemplary package comprising an acoustic device and a passive device configured as cap for the acoustic device.

FIG. 3 illustrates a cross sectional profile view of a package 300 that includes an acoustic device and a cap substrate comprising an inductor. The package 300 is coupled to a board 106 through a plurality of solder interconnects 107. The package 300 and the board 106 may be part of an assembly. The package 300 is similar to the package 100 of FIG. 1. However, in the package 300, the acoustic device 102 is coupled to the passive device 104 differently. For example, the package 300 may not include a polymer frame that couples the acoustic device 102 to the passive device 104. The package 300 includes a plurality of interconnects 305 and a plurality of interconnects 307. In some implementations, the plurality of interconnects 305 and/or the plurality of interconnects 307 may considered part of the passive device 104. The plurality of interconnects 305 may include copper (Cu). The plurality of interconnects 307 may include tin (Sn). The plurality of interconnects 307 may include gold (Au). The plurality of interconnects 307 may include tin and gold. The plurality of interconnects 305 and/or the plurality of interconnects 307 may be configured as a frame (e.g., metal frame, means for a frame) for the package 300. The plurality of interconnects 305 may be a plurality of frame interconnects. The plurality of interconnects 305 may be a plurality of frame interconnects.

The package 300 includes the acoustic device 102 and the passive device 104. The passive device 104 is coupled to the acoustic device 102 through the plurality of interconnects 305 and the plurality of interconnects 307. The passive device 104 is coupled to the board 106 through the plurality of solder interconnects 107. The package 300 includes a cavity 103 that is located between the acoustic device 102 and the passive device 104. The cavity 103 may be defined by at least the acoustic device 102, the passive device 104, the plurality of interconnects 305 and the plurality of interconnects 307.

The acoustic device 102 includes a substrate 120, an acoustic element 121 and a plurality of interconnects 122. The plurality of interconnects 122 may be coupled to the acoustic element 121. The substrate 120 may include a piezoelectric substrate. The substrate 120 may include a piezoelectric material. In some implementations, the substrate 120 may be entirely a piezoelectric material. In some implementations, a piezoelectric material may be formed over a surface of the substrate 120. The plurality of interconnects 122 is coupled to the acoustic element 121. An example of an acoustic element includes a transducer. The acoustic device 102 may be configured to operate as a filter (e.g., RF filter). For example, the acoustic element 121 (e.g., transducer) of the acoustic device 102 may be configured to operate as a filter. The acoustic device 102 may be configured to operate as a surface acoustic wave (SAW) filter or a bulk acoustic wave (BAW) filter. More specific examples of an acoustic device and/or a filter device is further described below in at least FIGS. 6 and 7.

The passive device 104 includes a cap substrate 140 and a plurality of interconnects 342. The plurality of interconnects 342 may be located in the cap substrate 140, over a first surface of the cap substrate 140, and over a second surface of the cap substrate 140. The plurality of interconnects 342 may include a plurality of interconnects 342a that is configured to operate as an inductor. The inductor may include a solenoid inductor. An example of how the plurality of interconnects 342a of a cap substrate 140 may be configured as an inductor is further described below in at least FIG. 5. The passive device 104 is located between the acoustic device 102 and the board 106. The passive device 104 may be configured as a cap for the acoustic device 102. The cap substrate 140 may be configured as a cap for the acoustic element 121 of the acoustic device 102. The inductor (which is defined by the plurality of interconnects 342a) may be configured as a cap for the acoustic element 121 of the acoustic device 102.

The inductor implemented in the cap substrate 140 may be configured to be electrically coupled to the acoustic device 102. For example, the inductor implemented in the cap substrate 140 may be configured to be electrically coupled to the acoustic element 121. The passive device 104 is coupled to the acoustic device 102 such that the cavity 103 is located between the passive device 104 and the acoustic device 102. The cavity 103 may be located between the acoustic element 121 and the cap substrate 140. For example, the cavity 103 may be located between the acoustic element 121 of the acoustic device 102 and the inductor (which may be defined by the plurality of interconnects 342a) of the passive device 104. A cavity may be at least one region that is free of a solid material. A cavity may be occupied by a gas (e.g., air). The cavity 103 may located over the acoustic element 121. The cavity 103 may include a cavity in the cap substrate 140. An example of a cavity (e.g., 510) that may be part of the cavity 103 is further described below in FIG. 5.

The plurality of interconnects 342 may also include a plurality of interconnects 342b. The plurality of interconnects 342b may extend through the thickness of the cap substrate 140.

The package 300 is coupled to the board 106 through the plurality of solder interconnects 107. The board 106 may include a printed circuit board (PCB). The board 106 may include at least one dielectric layer 160 and a plurality of board interconnects 162. The plurality of solder interconnects 107 is coupled to the plurality of board interconnects 162 and interconnects from the plurality of interconnects 342.

In some implementations, one or more electrical signals may travel through the inductor (e.g., defined by interconnects 342a), the interconnects 342 of the cap substrate 140, the interconnects 305, the interconnects 307 and/or the interconnects 122 from the acoustic device 102. For example, an electrical signal may travel through the interconnect 342b, an interconnect 305, an interconnect 307 and an interconnect 122. Similarly, an electrical signal may travel through the interconnect 122, an interconnect 307, an interconnect 305 and an interconnect 342b. In some implementations, additional layers of materials may be added to provide a more robust and crack resistant package.

Figure 4:
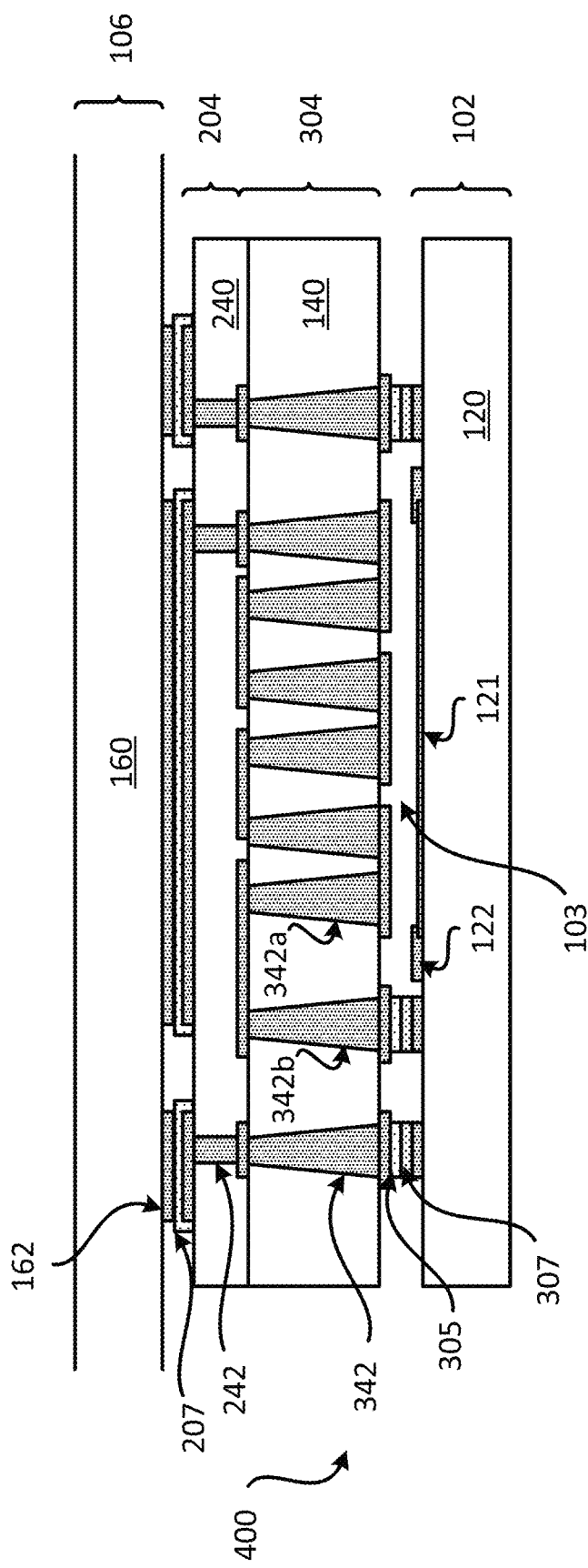
FIG. 4 illustrates a cross sectional profile view of another exemplary package comprising an acoustic device, a passive device configured as cap for the acoustic device and a redistribution layer.

FIG. 4 illustrates a package 400 that includes an additional metallization portion and/or a metallization layer. The package 400 is similar to the package 300, and includes similar components configured in a similar manner as described for the package 300. The package 400 includes the acoustic device 102, the passive device 104, the cavity 103 and the metallization portion 204. The passive device 104 is coupled to the acoustic device 102 through the plurality of interconnects 305 and/or the plurality of interconnects 307. The metallization portion 204 is coupled to a surface of the passive device 104. The metallization portion 204 may be a redistribution portion and/or a stress buffer portion. The metallization portion 204 includes at least one dielectric layer 240 and a plurality of interconnects 242. The plurality of interconnects 242 may be coupled to the plurality of interconnects 342. The plurality of interconnects 242 may be coupled to the inductor of the cap substrate 140. For example, the plurality of interconnects 242 may be coupled to the plurality of interconnects 342a. The plurality of interconnects 242 may include a plurality of metallization interconnects. The plurality of metallization interconnects may include a plurality of redistribution interconnects.

The package 400 is coupled to the board 106 through the plurality of interconnects 207. The plurality of interconnects 207 may be coupled to the plurality of board interconnects 162 and the plurality of interconnects 242 of the metallization portion 204. The plurality of interconnects 207 may include a land grid array (LGA). The plurality of interconnects 207 may include a metal layer. The metallization portion 204 is located between the passive device 104 and the board 106.

Figure 5:
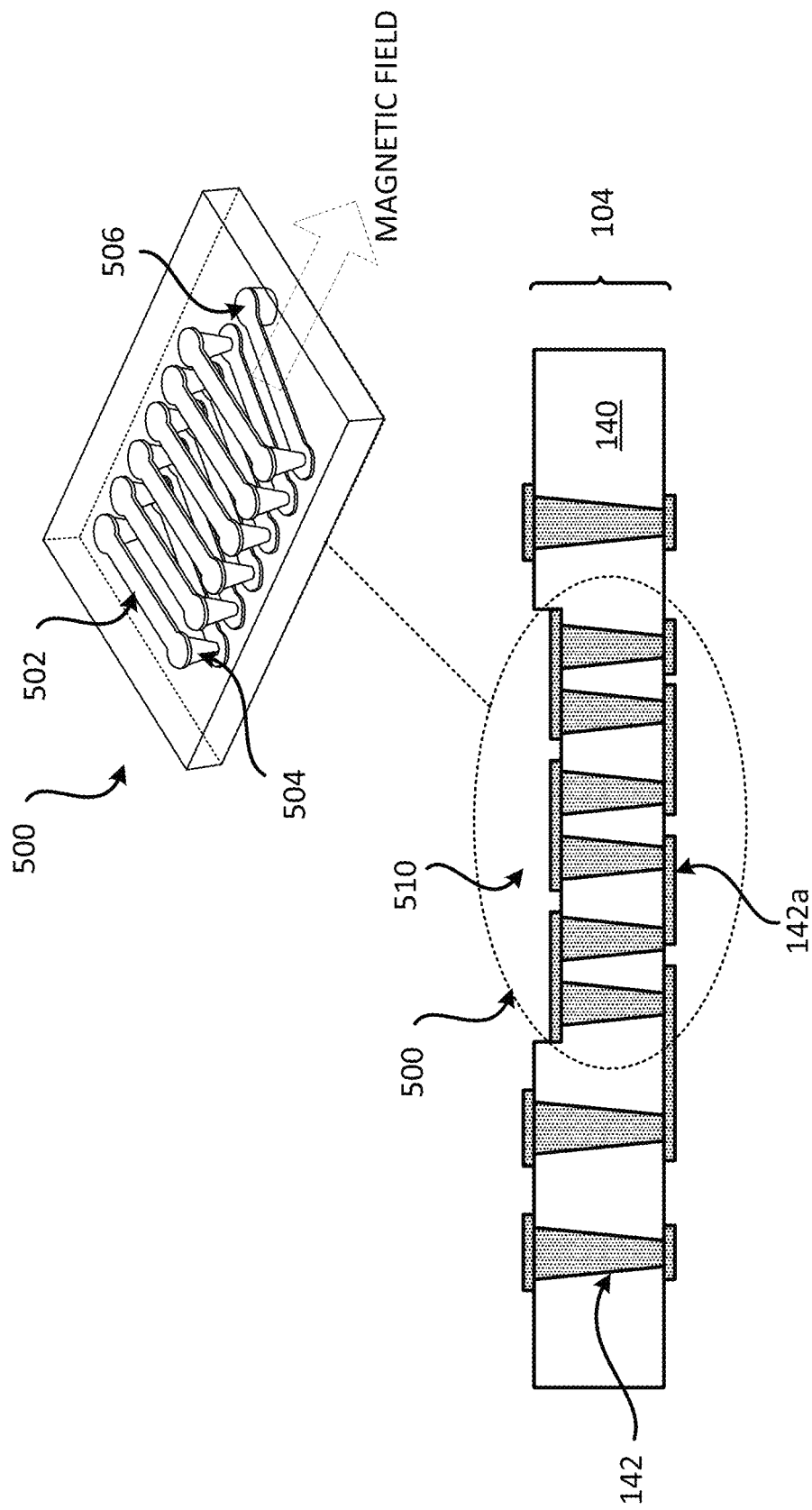
FIG. 5 illustrates an exemplary inductor that may be implemented in the passive device.

FIG. 5 illustrates the passive device 104 that includes a solenoid inductor. The passive device 104 includes the cap substrate 140, a cavity 510, an inductor 500 and the plurality of interconnects 142. The cavity 510 may include a trench. The cavity 510 is formed through a surface of the cap substrate 140. The cavity 510 may be located over the inductor 500. The cavity 510 may be optional. The inductor 500 may be defined by a plurality of interconnects 502, a plurality of interconnects 504 and a plurality of interconnects 506. The plurality of interconnects 502, a plurality of interconnects 504 and a plurality of interconnects 506 may correspond to the plurality of interconnects 142*a* of the passive device 104. The plurality of interconnects 502, a plurality of interconnects 504 and a plurality of interconnects 506 may correspond to the plurality of interconnects 342*a* of the passive device 304. The plurality of interconnects 502 is coupled to the plurality of interconnects 504. The plurality of interconnects 504 is coupled to the plurality of interconnects 506. The plurality of interconnects 502 may be located on a first surface of the cap substrate 140. The plurality of interconnects 504 may be located in the cap substrate 140. The plurality of interconnects 506 may be located on a second surface of the cap substrate 140. The inductor 500 is implemented with the cap substrate 140 such that a magnetic field generated by the inductor 500 points in a direction that is parallel to the first surface (e.g., first planar surface) and/or the second surface (e.g., first planar surface) of the cap substrate 140. This direction of the magnetic field results in the magnetic field to interfere less with the operation and performance of the acoustic element 121. However, different implementations may configure the inductor 500 differently. In some implementations, the plurality of interconnects 502, the plurality of interconnects 504 and the plurality of interconnects 506 may have a thickness of at least 10 micrometers and a width of at least 30 micrometers, in order to handle the high frequencies and high power of the signals that may travel through the inductor 500. The inductor 500 may be configured to be electrically coupled to the acoustic device 102 (e.g., electrically coupled to the acoustic element 121). The inductor 500 may be configured to be a passive component (e.g., matching element) together with an acoustic device 102 (e.g., matching element for the acoustic element 121) in a filter topology.

The package 100, the package 200, the package 300 and the package 400 provide a compact package that can be configured to a filter. The package 100, the package 200, the package 300 and the package 400 may be small enough to be implemented in very small devices, while still providing effective and efficient filtering of signals. This is achieved by using a cap that can also function as an inductor. Moreover, the passive device 104 and/or the passive device 304 may be configured to provide one or more electrical paths for a signal to travel between the acoustic device 102 and the board 106. Thus, the passive device 104 and/or the passive device 304 provide multiple functionalities for the package (e.g., 100, 200, 300, 400).

In some implementations, the package 100 that includes the acoustic device 102, the polymer frame 105, the passive device 104, and the cavity 103, may have a thickness of about 200 micrometers or less. In some implementations, the package 200 that includes the acoustic device 102, the polymer frame 105, the passive device 104, the cavity 103, and the metallization portion 204 may have a thickness of about 450 micrometers or less. The polymer frame 105 may be an example of a means for a frame.

In some implementations, the package 300 that includes the acoustic device 102, the plurality of interconnects 305, the plurality of interconnects 307, the passive device 104, and the cavity 103, may have a thickness of about 200 micrometers or less. In some implementations, the package 400 that includes the acoustic device 102, the plurality of interconnects 305, the plurality of interconnects 307, the passive device 104, the cavity 103, and the metallization portion 204 may have a thickness of about 450 micrometers or less.

Moreover, the acoustic device 102 and the passive device 104 may be configured to have a coefficient of thermal expansion (CTE) that are close to each other, which can help with reduce stress of the package due to CTE mismatch between different components. In some implementations, the acoustic device 102 may have a CTE of about 2.6 parts per million (ppm). In some implementations, the acoustic device 102 may have a CTE in a range of about 3-4 ppm. In some implementations, the difference in CTE between the CTE of the passive device 104 and the CTE of the acoustic device 102 is about 2 ppm or less. The board 106 may have a CTE in a range of about 14-16 ppm. The mismatch of the CTEs of the board 106 and the passive device 104 may be reduced by providing the metallization portion 204 between the board 106 and the passive device 104. The metallization portion 204 may be configured as a stress buffer layer and/or a redistribution layer. It is noted that different implementations may have different CTE values for the various components and/or devices.

In some implementations, the substrate 120 may include silicon (Si). The cap substrate 140 may include glass. The at least one dielectric layer 240 may include a polymer. However, different implementations, may use different materials for the various materials mentioned above. Although not shown in FIGS. 1-5, the plurality of interconnects 142, the plurality of interconnects 342, the plurality of interconnects 242 and/or the plurality of interconnects 122 may include a seed layer. The polymer frame 105 may be configured to create a frame that laterally surrounds and/or defines the cavity 103. The polymer frame 105 may be configured to create a frame that laterally surrounds the acoustic element 121. The plurality of interconnects 305 and/or the plurality of interconnects 307 may be configured to create a frame (e.g., metal frame) that laterally surrounds and/or defines the cavity 103. The plurality of interconnects 305 and/or the plurality of interconnects 307 may be configured to create a frame (e.g., metal frame) that laterally surrounds the acoustic element 121. In some implementations, other interconnects that are directly coupled to the plurality of interconnects 305 and/or the plurality of interconnects 307 may be considered part of the frame.

Figure 6:
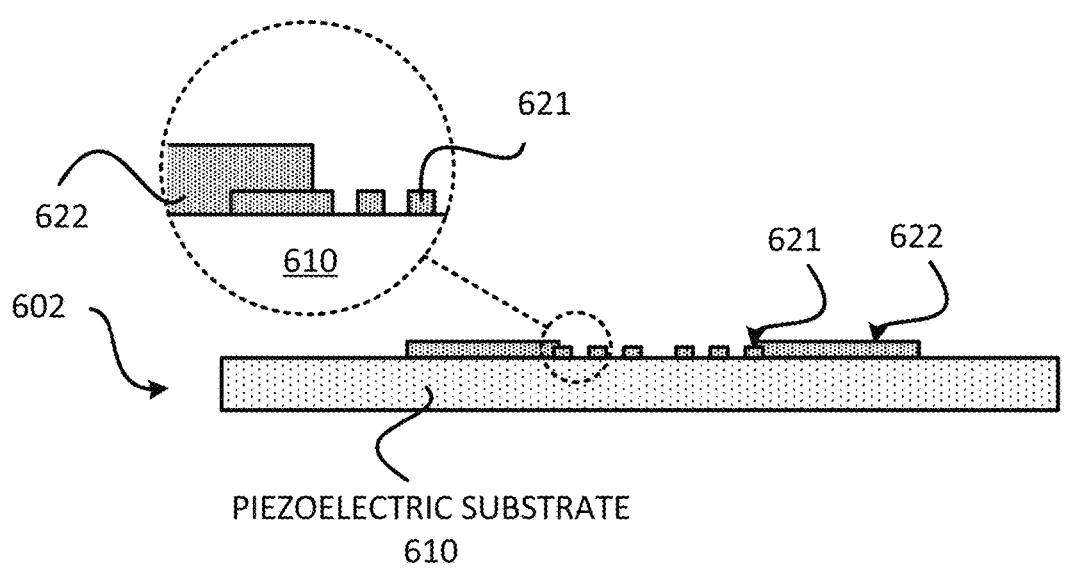
FIG. 6 illustrates a cross sectional profile view of an exemplary acoustic device.
Figure 7:
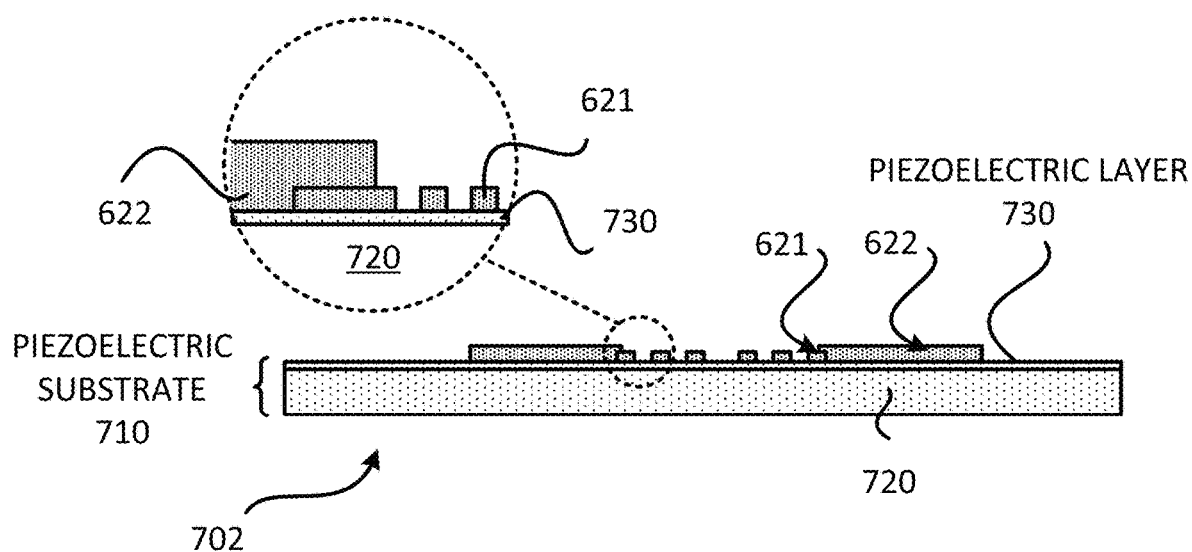
FIG. 7 illustrates a cross sectional profile view of another exemplary acoustic device.

FIGS. 6 and 7 illustrate cross sectional profile views of several exemplary acoustic devices. The various acoustic devices may be configured as filters (e.g., signal filters, radio frequency (RF) filters).

FIG. 6 illustrates an acoustic device 602 that includes a substrate 610, an acoustic element 621 and a plurality of interconnects 622. The acoustic device 602 may represent the acoustic device 102. The substrate 610 may be a piezoelectric substrate. The substrate 610 may include a piezoelectric material (e.g., Aluminum Nitride (AlN), Lithium Niobate, Lithium Tantalate).

The acoustic element 621 and the plurality of interconnects 622 may be formed over and coupled to the substrate 610. The acoustic element 621 and the plurality of interconnects 622 may be defined from at least one metal layer (e.g., electrically conductive material), such as Aluminum (Al), Molybdenum (Mo), and/or copper (Cu). The metal layer(s) may be patterned and/or configured as interconnects, electrodes and/or transducers for the acoustic device 602. The acoustic element 621 may include a first metal layer, and the plurality of interconnects 622 may include a second metal layer. The first metal layer may be thinner than the second metal layer. The first metal layer may be configured to operate as at least one acoustic element 621 (e.g., transducer), and the second metal layer may be configured as a plurality of interconnects 622 coupled to the acoustic element (e.g., transducer). In another example, the piezoelectric substrate may include a substrate and a piezoelectric layer that is formed and located over a surface of the substrate.

FIG. 7 illustrates an acoustic device 702 that includes a substrate 710, an acoustic element 621 and a plurality of interconnects 622. The acoustic device 702 may represent the acoustic device 102. The substrate 710 may be a piezoelectric substrate. The substrate 710 may include a substrate 720 and a piezoelectric layer 730 located over a surface of the substrate 720. The substrate 720 may include silicon (Si). The substrate 710 may include a piezoelectric material (e.g., Lithium Niobate, Lithium Tantalate). For example, the piezoelectric layer 730 may include Aluminum Nitride (AlN), Lithium Niobate, and/or Lithium Tantalate. The acoustic element 621 is located over the piezoelectric layer 730. Similarly, the plurality of interconnects 622 is located over the piezoelectric layer 730.

A piezoelectric substrate as used in the disclosure may mean a substrate that includes a piezoelectric material (e.g., as shown in the acoustic device 602) and/or a substrate that includes a piezoelectric layer coupled to and located over a surface of the substrate (e.g., as shown in the device 702). Different implementations may use different materials for the piezoelectric material and/or the piezoelectric layer.

Any acoustic device (e.g., 102) described in the disclosure may be implemented as the acoustic device 602 and/or the acoustic device 702. The acoustic devices (e.g., 602, 702) may be implemented as a micro-electromechanical system (MEMS) device. The acoustic devices (e.g., 602, 702) may be implemented as a die (e.g., bare die). The acoustic devices 602 and/or 702 may be configured as acoustic wave (SAW) filters. The acoustic devices 602 and/or 702 may be configured as bulk acoustic wave (BAW) filters. The acoustic device (e.g., 602, 702) may be means for signal filtering and/or means for signal extraction. Signal filtering may include signal extraction.

Having describes various packages with an acoustic device and a passive device, a sequence for fabricating an acoustic device will now be described below.

Exemplary Sequence for Fabricating an Acoustic Device

Figure 8:
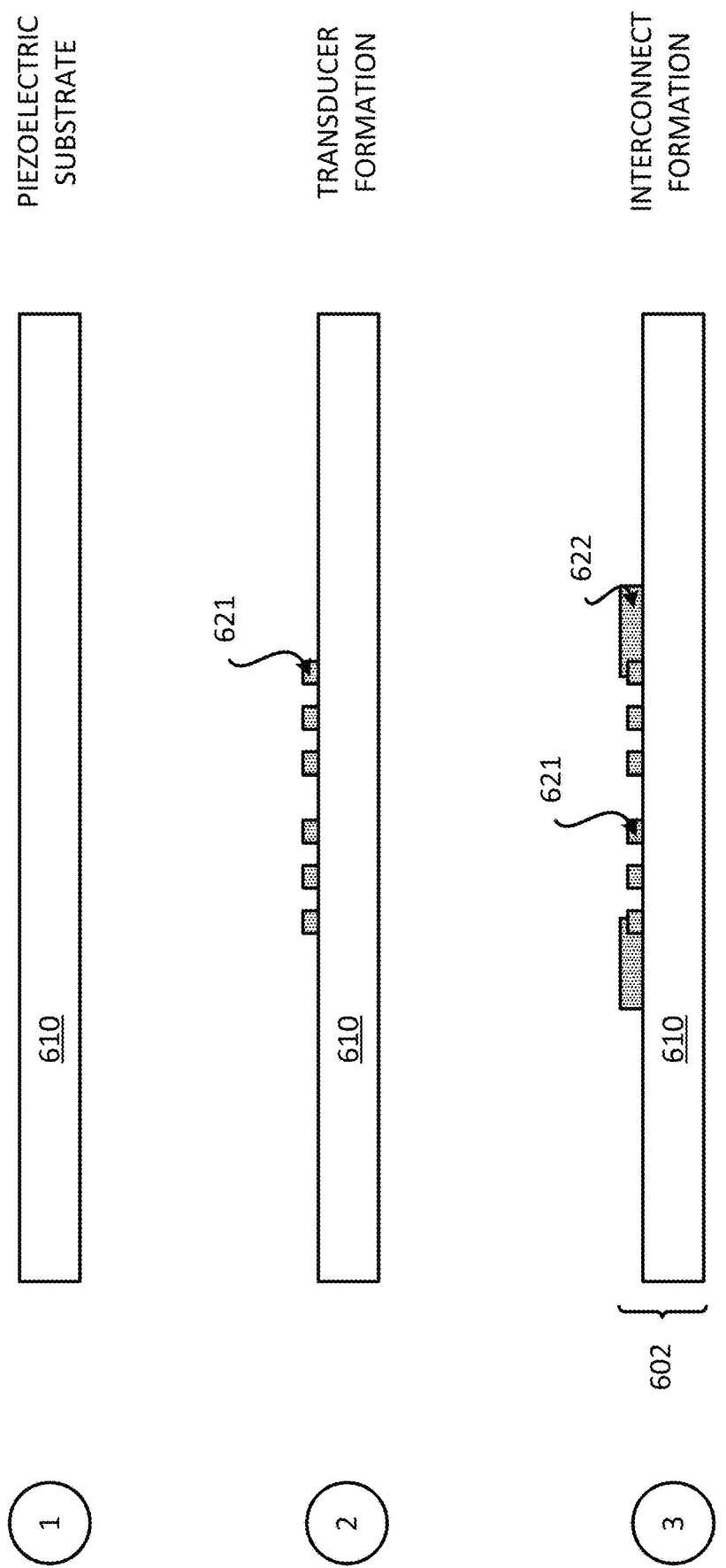
FIG. 8 illustrates an exemplary sequence for fabricating an acoustic device.

In some implementations, fabricating an acoustic device includes several processes. FIG. 8 illustrates an exemplary sequence for providing or fabricating an acoustic device. In some implementations, the sequence of FIG. 8 may be used to provide or fabricate the acoustic device 602 of FIG. 6. However, the process of FIG. 8 may be used to fabricate any of the acoustic devices described in the disclosure.

It should be noted that the sequence of FIG. 8 may combine one or more stages in order to simplify and/or clarify the sequence for providing or fabricating an acoustic device. In some implementations, the order of the processes may be changed or modified. In some implementations, one or more of processes may be replaced or substituted without departing from the spirit of the disclosure.

Stage 1, as shown in FIG. 8, illustrates a state after a substrate 610 is provided. The substrate 610 may be a piezoelectric substrate. The substrate 610 may include a piezoelectric material. In some implementations, the substrate 610 includes silicon (Si). Different implementations may use different material may be used for the piezoelectric material (e.g., Lithium Niobate, Lithium Tantalate).

Stage 2 illustrates a state after the acoustic element 621 is formed over the substrate 610. The acoustic element 621 may be defined by forming and patterning at least one metal layer over the substrate 610. A patterning (masking) and an evaporation (or plating) process may be used to form the at least one metal layer, which may define the acoustic element 621. The acoustic element 621 may include a transducer.

Stage 3 illustrates a state after a plurality of interconnects 622 is formed over the substrate 610. The plurality of interconnects 622 may be coupled to the acoustic element 621. The plurality of interconnects 622 may be defined by forming and patterning at least one metal layer over the substrate 610. A patterning (masking) and an evaporation (or a plating) process may be used to form the at least one metal layer, to form the plurality of interconnects 622. Stage 3 may illustrate the acoustic device 602 that includes the substrate 610, the acoustic element 621 and the plurality of interconnects 622.

Exemplary Sequence For Fabricating an Acoustic Device

Figure 9:
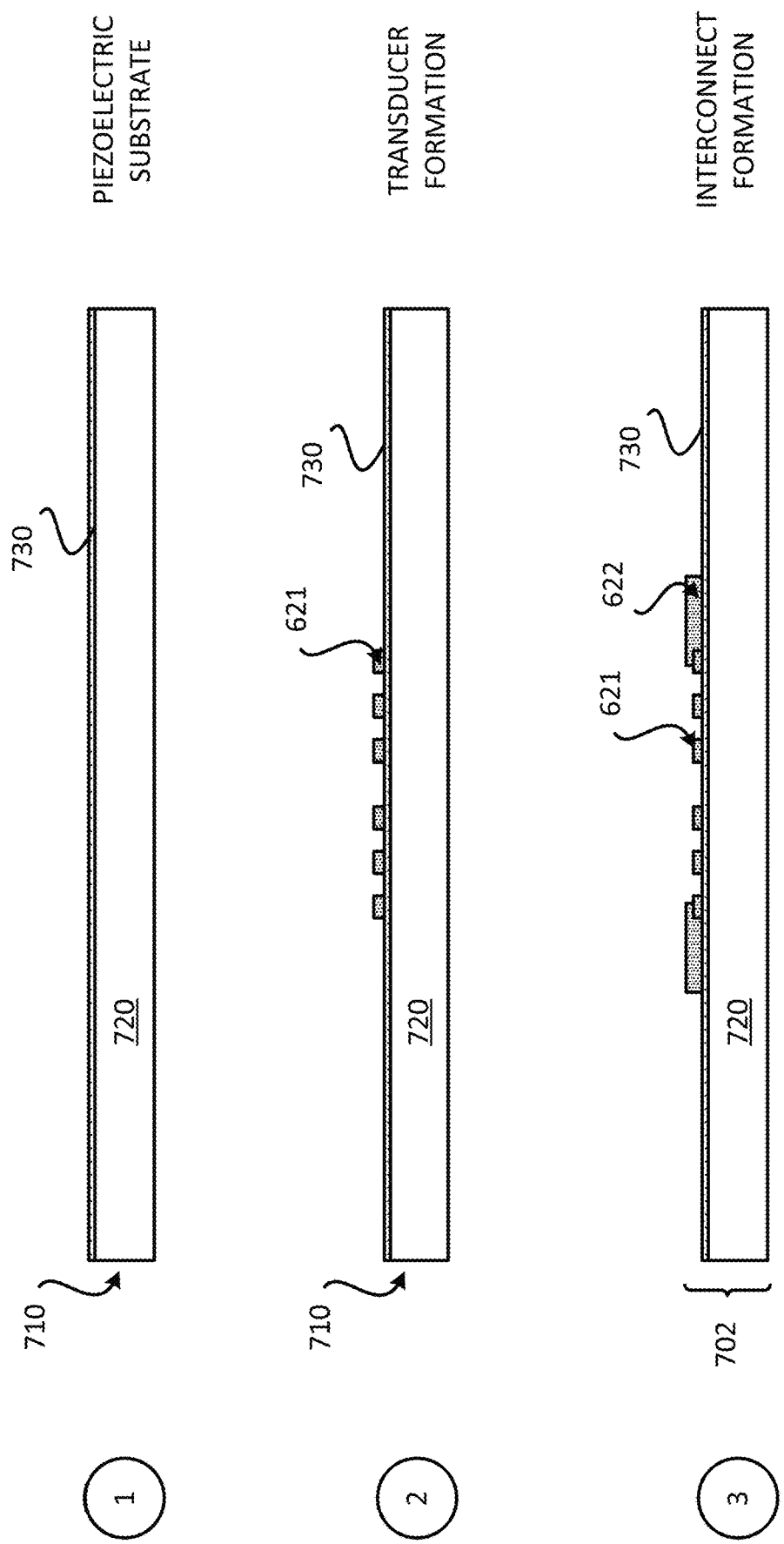
FIG. 9 illustrates an exemplary sequence for fabricating an acoustic device.

In some implementations, fabricating an acoustic device includes several processes. FIG. 9 illustrates an exemplary sequence for providing or fabricating an acoustic device. In some implementations, the sequence of FIG. 9 may be used to provide or fabricate the acoustic device 702 of FIG. 7. However, the process of FIG. 9 may be used to fabricate any of the acoustic devices described in the disclosure.

It should be noted that the sequence of FIG. 9 may combine one or more stages in order to simplify and/or clarify the sequence for providing or fabricating an acoustic device. In some implementations, the order of the processes may be changed or modified. In some implementations, one or more of processes may be replaced or substituted without departing from the spirit of the disclosure.

Stage 1, as shown in FIG. 9, illustrates a state after a substrate 710 is provided. The substrate 710 may be a piezoelectric substrate. The substrate 710 may include a substrate 720 and a piezoelectric layer 730 coupled to and located over a surface of the substrate 720. In some implementations, the substrate 720 includes silicon (Si). Different implementations may use different material may be used for the piezoelectric material (e.g., Lithium Niobate, Lithium Tantalate).

Stage 2 illustrates a state after the acoustic element 621 is formed over the substrate 710. The acoustic element 621 may be coupled to and located over the piezoelectric layer 730. The acoustic element 621 may be defined by forming and patterning at least one metal layer over the substrate 710. A patterning and an evaporation (or a plating) process may be used to form the at least one metal layer, which may define the acoustic element 621. The acoustic element 621 may include a transducer.

Stage 3 illustrates a state after a plurality of interconnects 622 is formed over the substrate 710. The plurality of interconnects 622 may be coupled to and located over the piezoelectric layer 730. The plurality of interconnects 622 may be coupled to the acoustic element 621. The plurality of interconnects 622 may be defined by forming and patterning at least one metal layer over the substrate 710. A patterning and an evaporation (or a plating) process may be used to form the at least one metal layer, to form the plurality of interconnects 622. Stage 3 may illustrate the acoustic device 702 that includes the substrate 710, the acoustic element 621 and the plurality of interconnects 622.

Exemplary Flow Diagram of a Method for Fabricating an Acoustic Device

Figure 10:
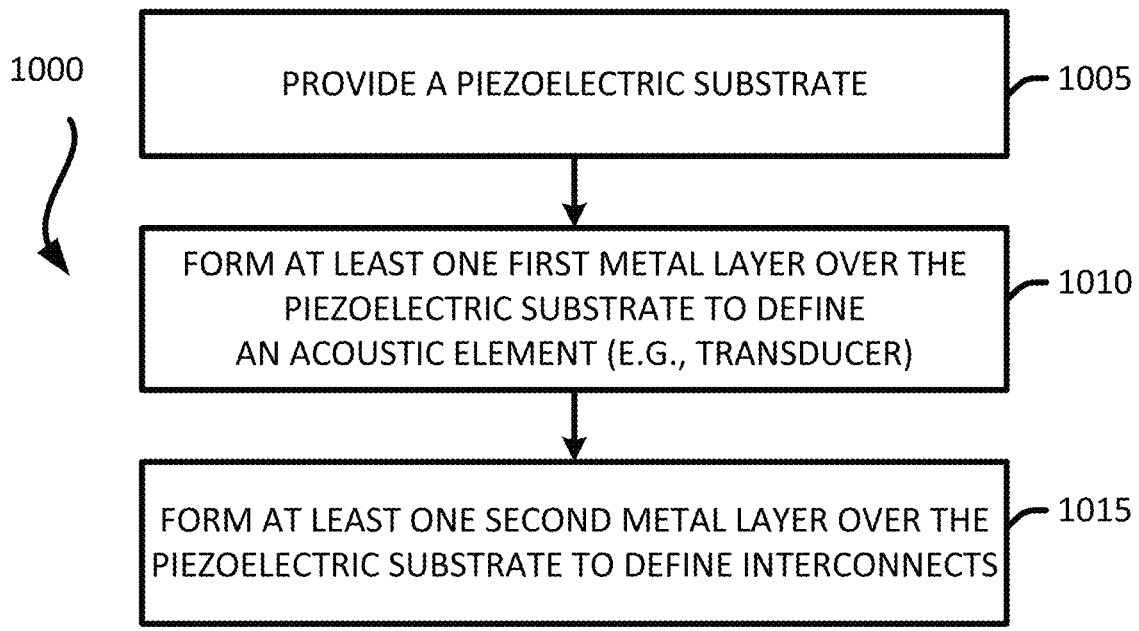
FIG. 10 illustrates an exemplary flow diagram of a method fabricating an acoustic device.

In some implementations, fabricating an acoustic device includes several processes. FIG. 10 illustrates an exemplary flow diagram of a method 1000 for providing or fabricating an acoustic device. In some implementations, the method 1000 of FIG. 10 may be used to provide or fabricate the acoustic device of FIGS. 6-7.

It should be noted that the method 1000 of FIG. 10 may combine one or more processes in order to simplify and/or clarify the method for providing or fabricating an acoustic device and a metallization portion. In some implementations, the order of the processes may be changed or modified.

The method provides (at 1005) a piezoelectric substrate (e.g., 610, 710). The entire substrate may be made of a piezoelectric material or only a portion of the substrate may include a piezoelectric material. For example, the substrate 710 may include a substrate 720 and a piezoelectric layer located over and coupled to the substrate 720. Different implementations may use different material may be used for the piezoelectric material and/or piezoelectric layer (e.g., Lithium Niobate, Lithium Tantalate). Stage 1 of FIG. 8 and Stage 1 of FIG. 9 illustrate and describe examples of providing a piezoelectric substrate.

The method forms (at 1010) at least one first metal layer over the substrate to form and define an acoustic element. The first metal layer may form the acoustic element 621. A patterning (masking) and an evaporation (or a plating) process may be used to form the at least one metal layer, which may define the acoustic element 621. The acoustic element 621 may include a transducer. Stage 2 of FIG. 8 and Stage 2 of FIG. 9 illustrates and describes an example of forming at least one first metal layer to form and define an acoustic element.

The method forms (at 1015) at least one second metal layer over the substrate to form and define a plurality of interconnects. The second metal layer may form the plurality of interconnects 622. The plurality of interconnects 622 may be coupled to the acoustic element 621. A patterning (masking) and an evaporation (or a plating) process may be used to form the at least one second metal layer, to form the plurality of interconnects 622. Stage 3 of FIG. 8 and Stage 3 of FIG. 9 illustrate and describe an example of forming at least one second metal layer to form and define a plurality of interconnects.

Exemplary Sequence for Fabricating a Package Comprising an Acoustic Device and a Passive Device with a Cap Substrate In some implementations, fabricating a package includes several processes. FIGS. 11A-11F illustrate an exemplary sequence for providing or fabricating a package. In some implementations, the sequence of FIGS. 11A-11F may be used to provide or fabricate the package 200 of FIG. 2. However, the process of FIGS. 11A-11F may be used to fabricate any of the packages (e.g., 100) described in the disclosure.

It should be noted that the sequence of FIGS. 11A-11F may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure.

Figure 11A:
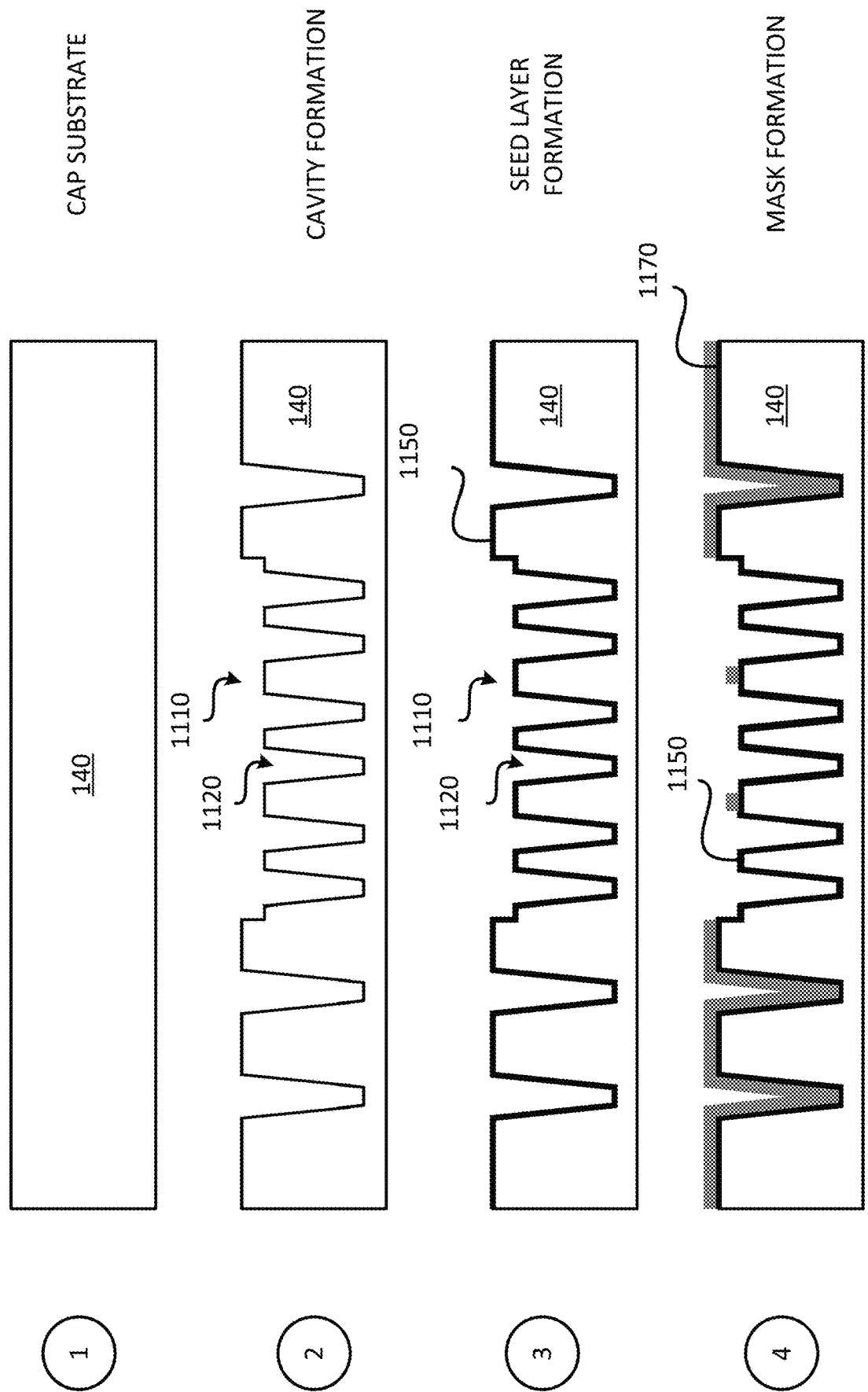

Stage 1, as shown in FIG. 11A, illustrates a state after a cap substrate 140 is provided. The cap substrate 140 may include glass.

Stage 2 illustrates a state after the cavity 1110 and the cavities 1120 are formed through a first surface of the cap substrate 140. A laser process (e.g., material modification, laser ablation, . . . ) and etching process may be used to form the cavity 1110 and the cavities 1120. An example of a laser process includes a laser induced deep etch. The cavity 1110 may include a trench. The cavity 1110 may extend partially through the thickness of the cap substrate 140. The depth of the cavity 1110 may vary with different implementations. The plurality of cavities 1120 may extend partially through the thickness of the cap substrate 140. In some implementations, a mask (not shown) with openings may be formed over the cap substrate 140 and an etching process may be used to form cavities through the openings of the mask. Once the cavities have been formed, the mask may be removed (e.g., resist strip, hard mask).

Stage 3 illustrates a state after a seed layer 1150 is formed over the cap substrate 140. A sputtering process may be used to form the seed layer 1150. The seed layer 1150 may be formed in and over the cavity 1110 and the cavities 1120. The seed layer 1150 may include titanium and/or copper.

Stage 4 illustrates a state after a mask 1170 is formed over the seed layer 1150. The mask 1170 may include openings that exposes the seed layer 1150. Forming a mask may include spin coating, photolithography and developing.

Figure 11B:
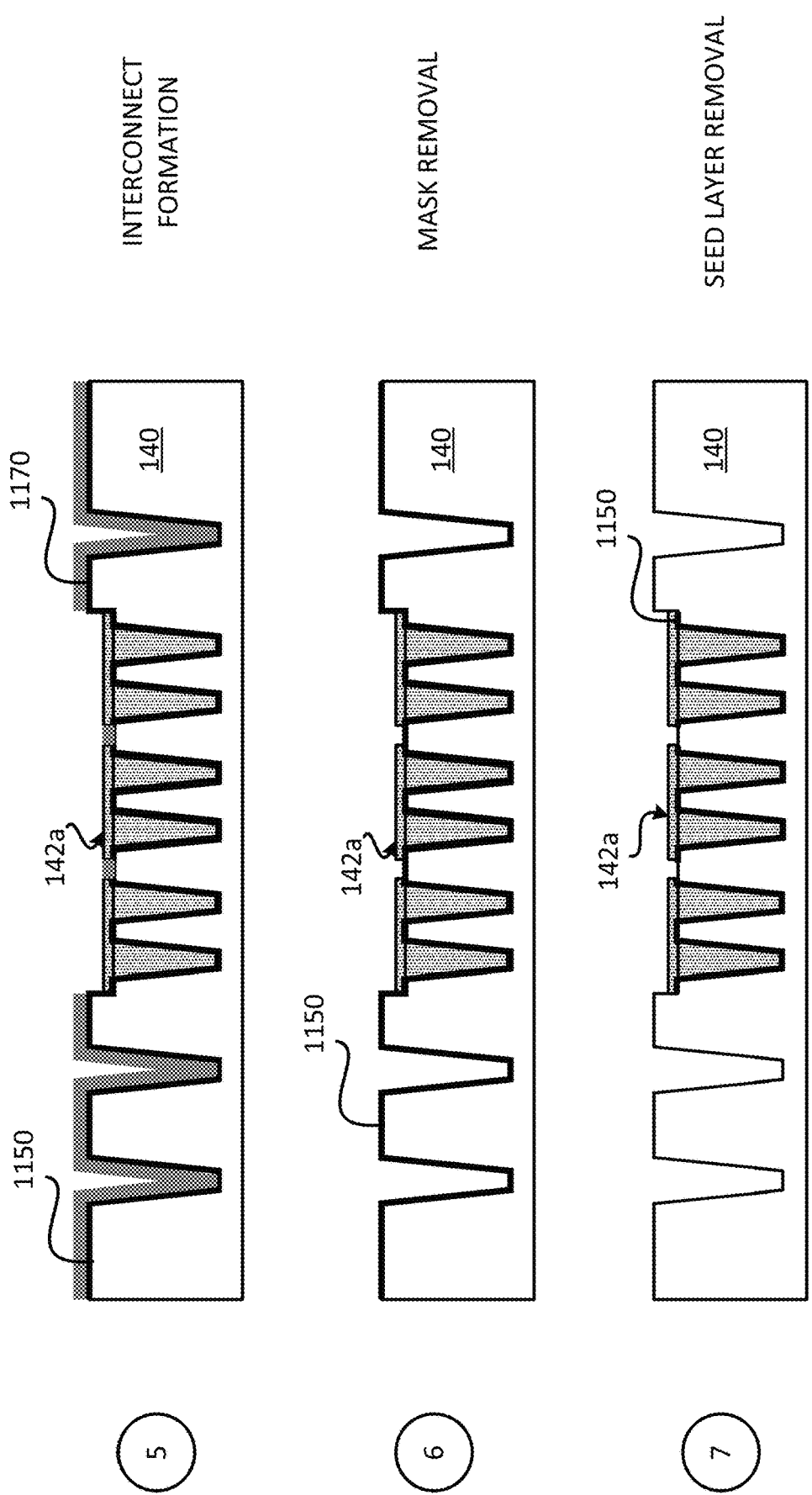

Stage 5, as shown in FIG. 11B, illustrates a state after a plurality of interconnects 142a is formed over the seed layer 1150 and through openings of the mask 1170. A plating process may be used to form the plurality of interconnects 142a.

Stage 6 illustrates a state after the mask 1170 is removed. Removing the mask 1170 may include stripping a resist.

Stage 7 illustrates a state after portions of the seed layer 1150 have been removed. For example, portions of the seed layer 1150 that are not covered by the plurality of interconnects 142a may be removed through an etching process. At least some of the remaining seed layer 1150 may be considered part of the plurality of interconnects 142a.

Stage 8, as shown in FIG. 11C, illustrates a state after the acoustic device 102 with the polymer frame 105 is provided. The acoustic device 102 includes a substrate 120, an acoustic element 121 and a plurality of interconnects 122. The polymer frame 105 may be provided over the acoustic device 102. A photolithography process or a laser structured process may be used to couple and form the polymer frame 105 to the acoustic device 102.

Stage 9 illustrates a state after the cap substrate 140 with the plurality of interconnects 142a is coupled to the acoustic device 102 through the polymer frame 105. Coupling the cap substrate 140 to the acoustic device 102 may form a cavity 103 between the cap substrate 140 and the acoustic device 102. For example, there may be a cavity 103 between the acoustic element 121 of the acoustic device 102 and the cap substrate 140. A bonding process may be used to couple the cap substrate 140 to the acoustic device 102. For example, a wafer to wafer bonding process may be used to couple the cap substrate 140 to the acoustic device 102 (e.g., coupled the cap substrate to the substrate 120).

Figure 11D:
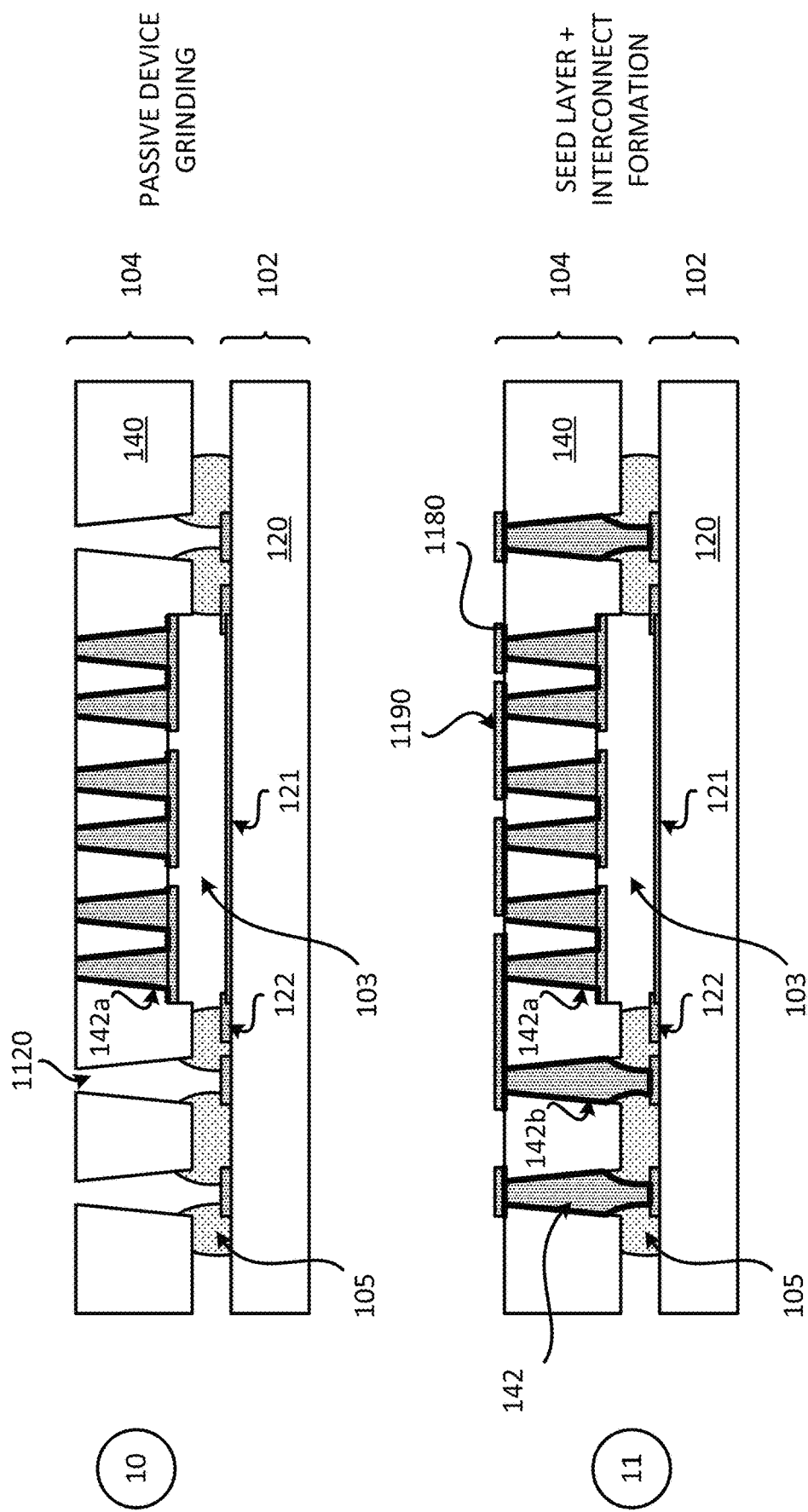

Stage 10, as shown in FIG. 11D, illustrates a state after portions of the cap substrate 140 are removed. For example, portions of the cap substrate 140 may be grinded out. Removing portions of the cap substrate 140 may also include removing portions of the plurality of interconnects 142a. Removing portions of the cap substrate 140 may also form openings in cavities 1120 of the cap substrate 140 that have not been filled with an interconnect.

Stage 11 illustrates a state after a seed layer 1180 and a plurality of interconnects 1190 are formed over the cap substrate 140. The seed layer 1180 and the plurality of interconnects 1190 may be provided and formed in a similar manner as described in Stages 3-7 of FIGS. 11A-11B. A sputtering or chemical seed layer plating (e.g., electroless copper) process may be used to form the seed layer 1180. A mask may be formed. The plurality of interconnects 1190 may be formed over the seed layer 1180 through openings in the mask. The mask may be removed and portions of the seed layer 1180 may be selectively removed (e.g., etched). The plurality of interconnects 1190 may include the seed layer 1180. The plurality of interconnects 1190 may be considered part of the plurality of interconnects 142a and/or the plurality of interconnects 142.

Figure 11E:
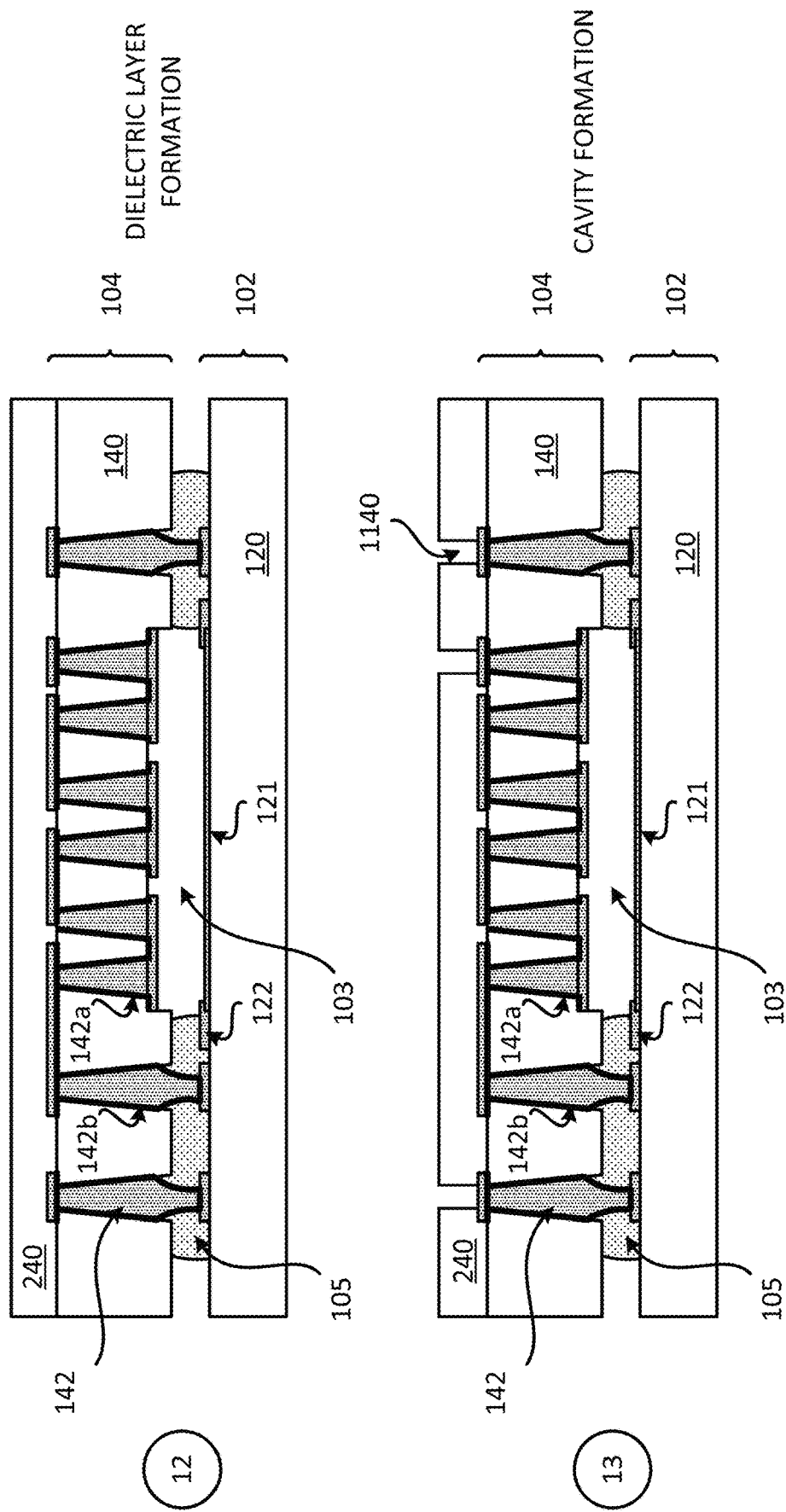
Figure 11F:
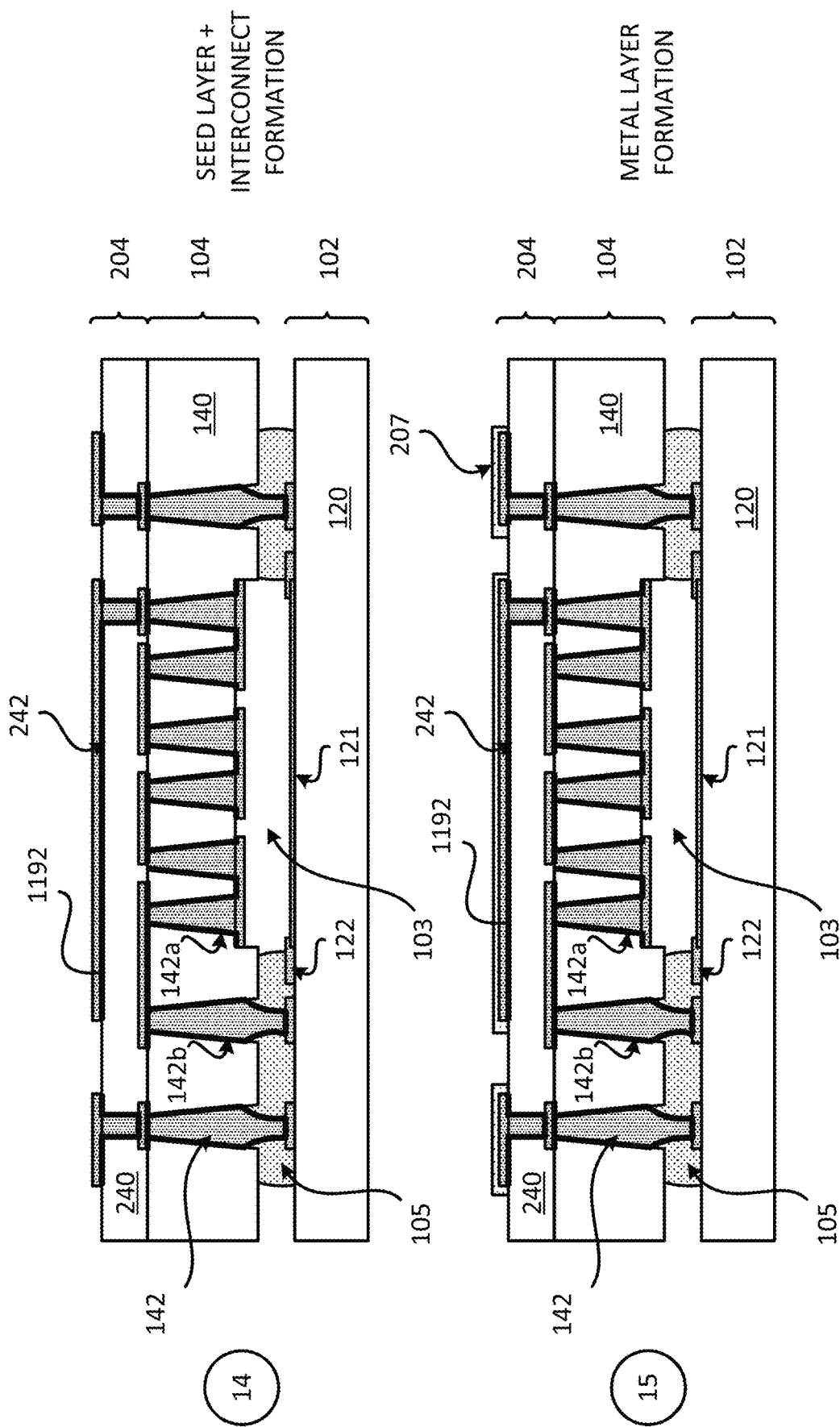

Stage 12, as shown in FIG. 11E, illustrates a state after a dielectric layer 240 is formed over a second surface of the passive device 104. The dielectric layer 240 may be formed over the second surface of the cap substrate 140 and interconnects located over the second surface of the cap substrate 140. A deposition process and/or a lamination process may be used to form the dielectric layer 240. The dielectric layer 240 may include a polymer.

Stage 13 illustrates a state after a plurality of cavities 1140 is formed in the dielectric layer 240. The plurality of cavities 1140 may be formed using a photo litho exposure and developing process (e.g., photo etching process) or laser process.

Stage 14, as shown in FIG. 11E, illustrate a state after a seed layer 1192 and a plurality of interconnects 242 are formed in the plurality of cavities 1140 and over the dielectric layer 240. The seed layer 1192 and the plurality of interconnects 242 may be provided in a similar manner as described in Stages 3-7 of FIGS. 11A-11B. A sputtering process may be used to form the seed layer 1192. A mask may be formed. The plurality of interconnects 242 may be formed over the seed layer 1192 through openings in the mask. The mask may be removed and portions of the seed layer 1192 may be selectively removed (e.g., etched). The plurality of interconnects 242 may include the seed layer 1192.

Stage 15 illustrates a state after a plurality of interconnects 207 is formed over the plurality of interconnects 242. A plating process may be used to form the plurality of interconnects 207. The plurality of interconnects 207 may include a land grid array (LGA). The plurality of interconnects 207 may include one or more metal layers. The plurality of interconnects 207 may include electro plated finishing or electroless plated finishing.

Once the package (e.g., 100, 200) is fabricated, the package may be coupled to a board 106 through a plurality of interconnects 107. For example, the package (e.g., 100, 200) may be coupled to the plurality of board interconnects 162 through the plurality of interconnects 107.

Exemplary Sequence for Fabricating a Package Comprising an Acoustic Device and a Passive Device with a Cap Substrate In some implementations, fabricating a package includes several processes. FIGS. 12A-12E illustrate an exemplary sequence for providing or fabricating a package. In some implementations, the sequence of FIGS. 12A-12E may be used to provide or fabricate the package 400 of FIG. 4. However, the process of FIGS. 12A-12E may be used to fabricate any of the packages (e.g., 300) described in the disclosure.

It should be noted that the sequence of FIGS. 12A-12E may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure.

Figure 12A:
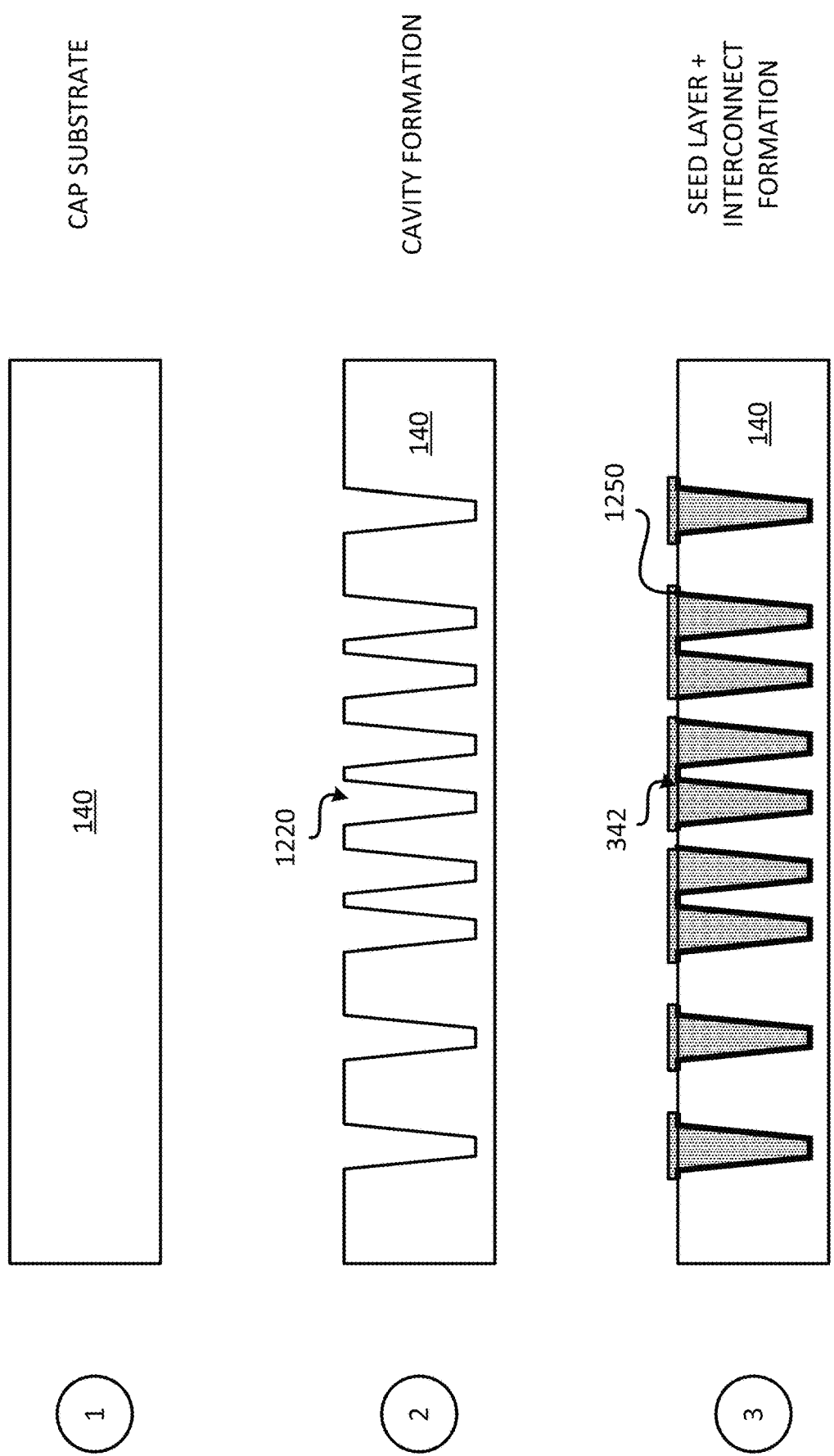
FIGS. 12A-12E illustrate an exemplary sequence for fabricating a package comprising an acoustic device and a passive device configured as cap for the acoustic device.

Stage 1, as shown in FIG. 12A, illustrates a state after a cap substrate 140 is provided. The cap substrate 140 may include glass.

Stage 2 illustrates a state after the cavities 1220 are formed through a first surface of the cap substrate 140. A laser process (e.g., material modification, laser ablation, . . . ) and etching process may be used to form the cavities 1120. The plurality of cavities 1220 may extend partially through the thickness of the cap substrate 140. In some implementations, a mask (not shown) with openings may be formed over the cap substrate 140 and an etching process may be used to form cavities through the openings of the mask. Once the cavities have been formed, the mask may be removed (e.g., resist strip, hard mask).

Stage 3 illustrates a state after a seed layer 1250 and a plurality of interconnects 342 are formed in and over the cap substrate 140. The seed layer 1250 may include titanium and/or copper. The seed layer 1250 and the plurality of interconnects 342 may be provided in a similar manner as described in Stages 3-7 of FIGS. 11A-11B. A sputtering process may be used to form the seed layer 1250. A mask may be formed. The plurality of interconnects 342 may be formed over the seed layer 1250 through openings in the mask. The mask may be removed and portions of the seed layer 1250 may be selectively removed (e.g., etched). The plurality of interconnects 342 may include the seed layer 1250.

Figure 12B:
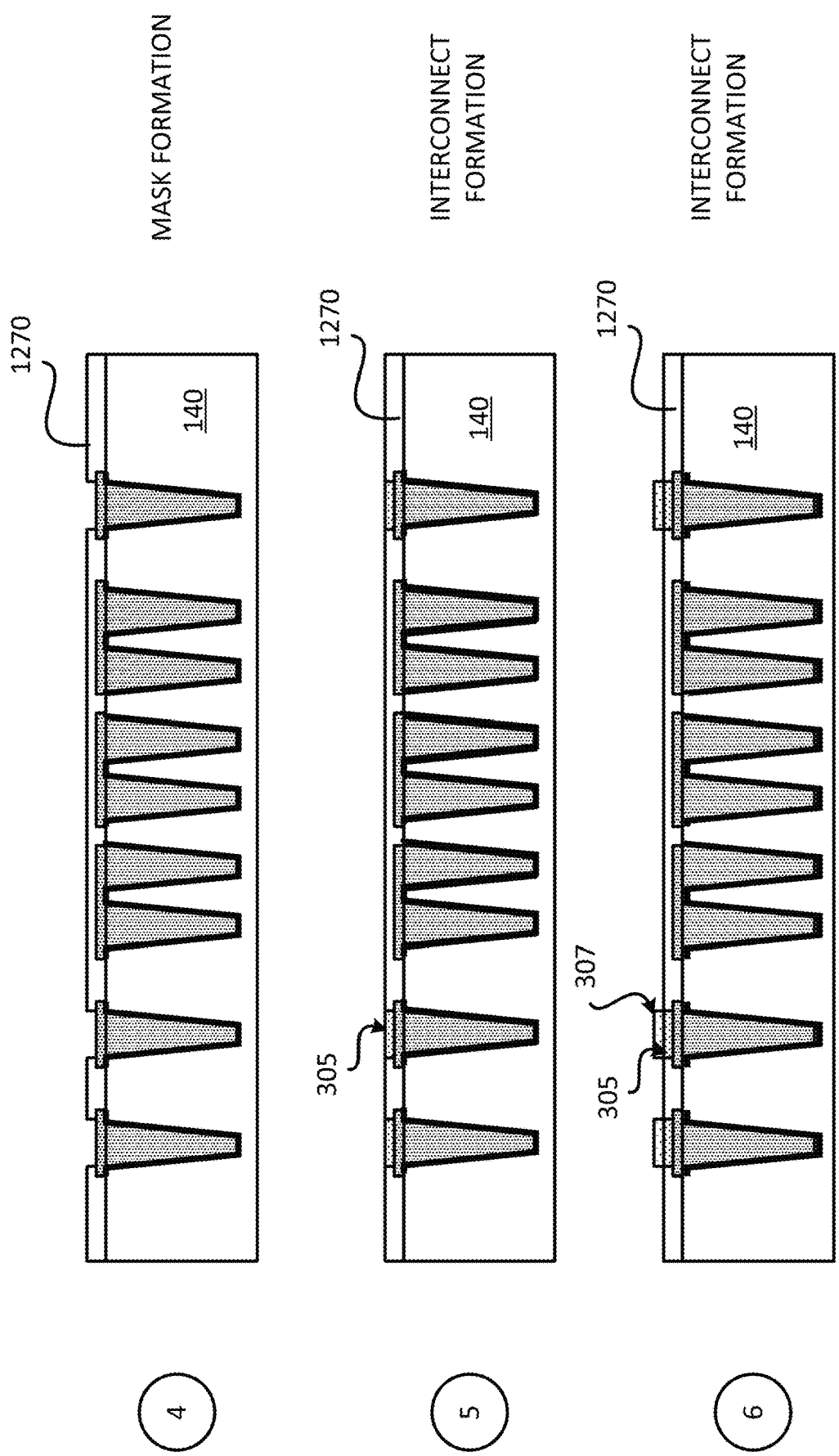

Stage 4, as shown in FIG. 12B, illustrates a state after a mask 1270 is formed over the cap substrate 140. The mask 1270 may include several openings.

Stage 5 illustrates a state after a plurality of interconnects 305 (e.g., a plurality of frame interconnects) is formed over the plurality of interconnects 342. The plurality of interconnects 305 may be formed through openings in the mask 1270. A plating process may be used to form the plurality of interconnects 305. The plurality of interconnects 305 may include copper. In some implementations, top portions of the mask 1270 and top portions of the plurality of interconnects 305 may be removed through a cutting and/or grinding process, to thin out the thickness of the plurality of interconnects 305.

Stage 6 illustrates a state after the plurality of interconnects 307 (e.g., a plurality of frame interconnects) is formed over the plurality of interconnects 305. A plating process may be used to form and couple the plurality of interconnects 307 to the plurality of interconnects 305. The plurality of interconnects 307 may include tin.

Figure 12C:
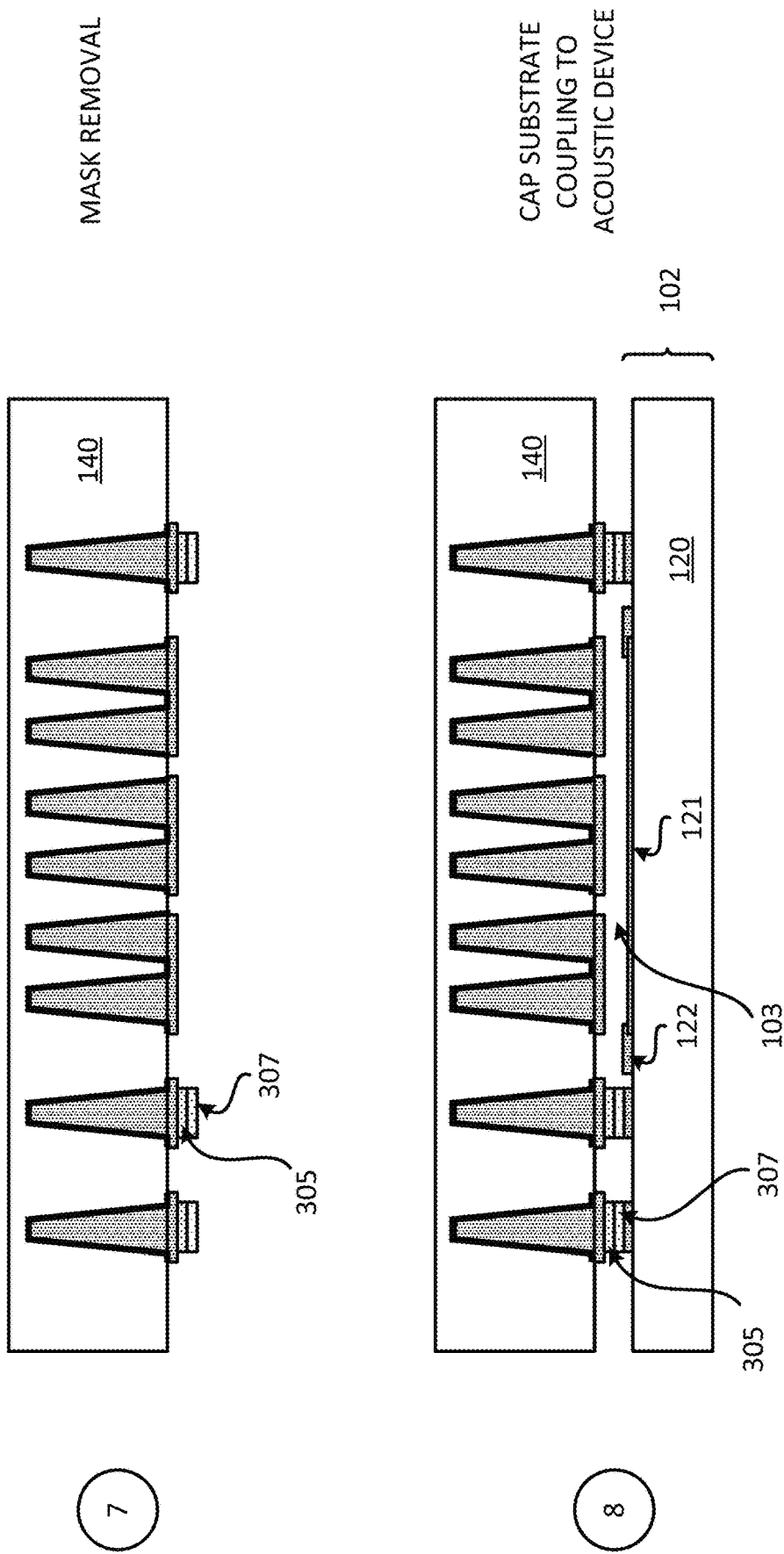
Figure 12D:
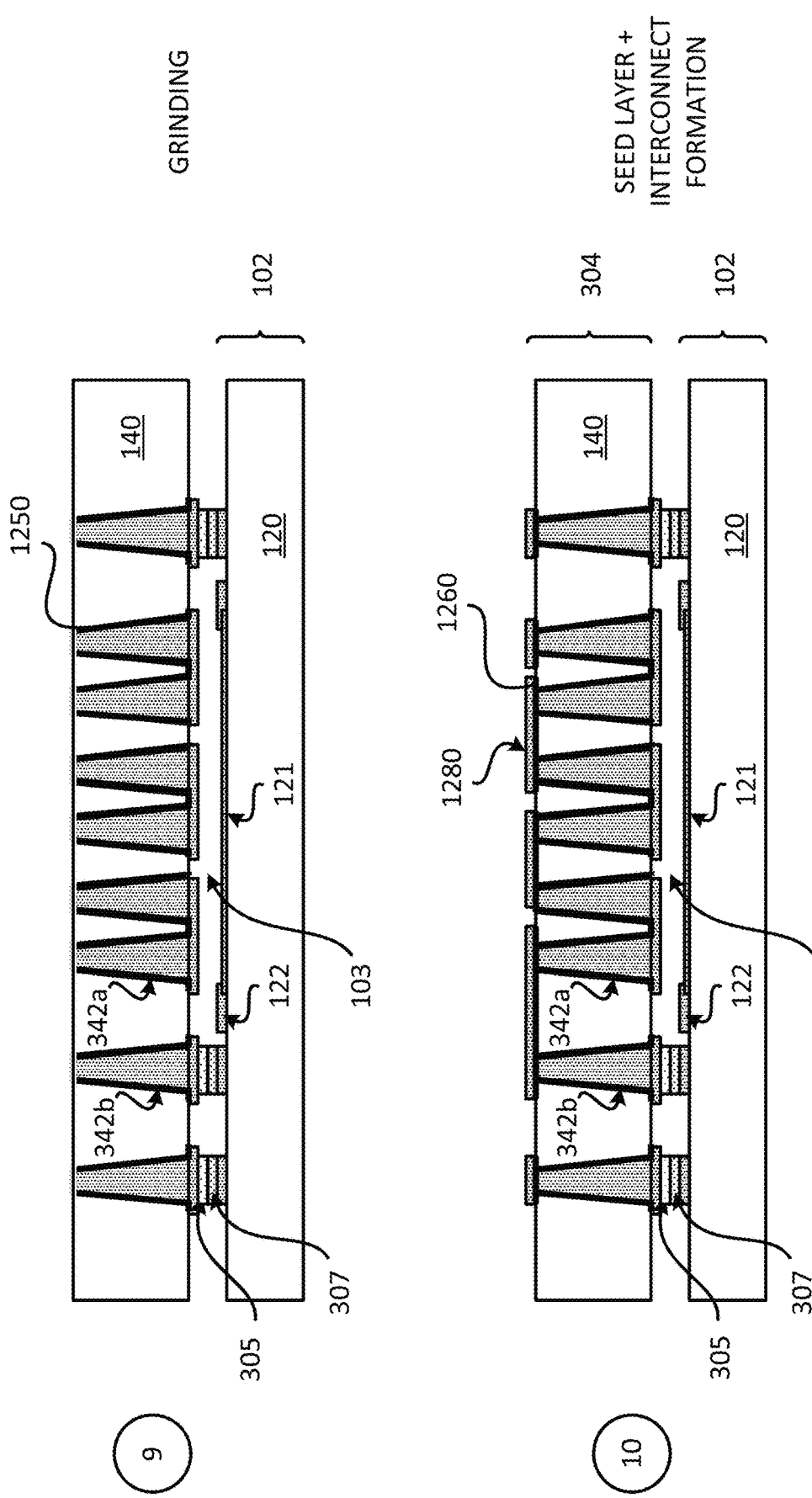

Stage 7, as shown in FIG. 12C, illustrates a state after the mask 1270 is removed. Removing the mask 1270 may include stripping a resist.

Stage 8 illustrates a state after the cap substrate 140 is coupled to the acoustic device 102 through the plurality of interconnects 305 and the plurality of interconnects 307. The plurality of interconnects 305 is coupled to the plurality of interconnects 307. The plurality of interconnects 307 may be coupled to the plurality of interconnects 122 of the acoustic device 102. The cap substrate 140 may be coupled to the acoustic device 102 through copper tin copper diffusion bonding. The plurality of interconnects 305 and the plurality of interconnects 307 may be configured as a frame for package.

Stage 9, as shown in FIG. 12C, illustrates a state after portions of the cap substrate 140 are removed. Removing portions of the cap substrate 140 may include remove portions of the plurality of interconnects 342 and/or portions of the seed layer 1250. A grinding process may be used to remove portions of the cap substrate 140, portions of the seed layer 1250 and/or portions of the plurality of interconnects 342.

Stage 10 illustrates a state after a seed layer 1260 and a plurality of interconnects 1280 are formed over the cap substrate 140. The seed layer 1260 and the plurality of interconnects 1280 may be coupled to the plurality of interconnects 342. The plurality of interconnects 1280 may include the seed layer 1260. The plurality of interconnects 1280 may be considered part of the plurality of interconnects 342. The seed layer 1260 and the plurality of interconnects 1280 may be provided in a similar manner as described in Stage 11 of FIG. 11D. Stage 10 may illustrate the passive device 304 that includes a cap substrate 140 and the plurality of interconnects 342. The passive device 304 may include the plurality of interconnects 305 and/or the plurality of interconnects 307. The plurality of interconnects 305 and/or the plurality of interconnects 307 may be configured as a frame for a package.

Figure 12E:
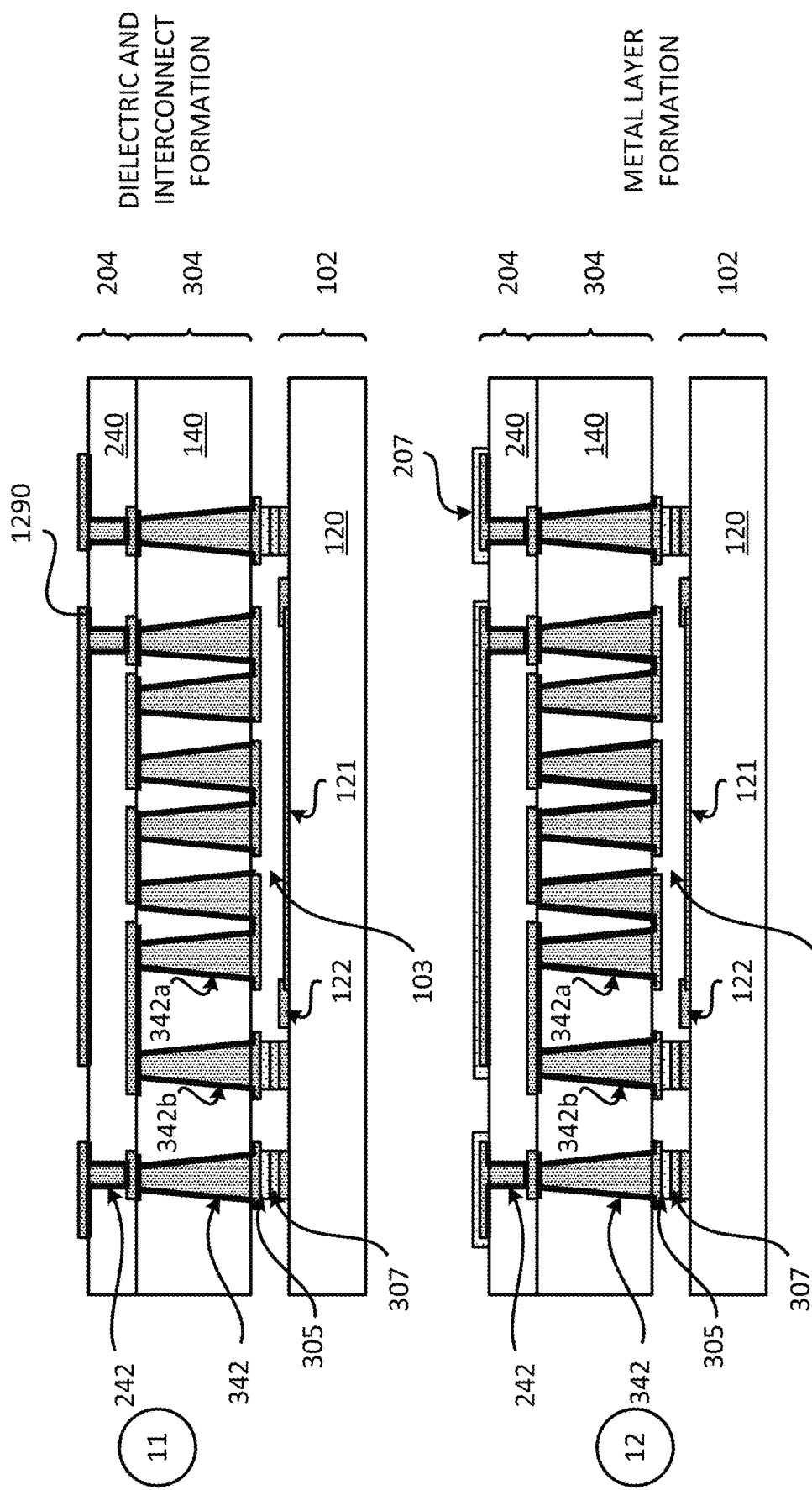

Stage 11, as shown in FIG. 12E illustrates a state after the dielectric layer 240, a seed layer 1290 and a plurality of interconnects 242 are formed. The dielectric layer 240, the seed layer 1290 and the plurality of interconnects 1242 may be provided in a similar manner as described in Stages 12-14 of FIGS. 11E-11F.

Stage 12 illustrates a state after a plurality of interconnects 207 is formed over the plurality of interconnects 242. A plating process may be used to form the plurality of interconnects 207. The plurality of interconnects 207 may include a land grid array (LGA). The plurality of interconnects 207 may include electro plated finishing or electroless (chemical) plated finishing which may include Ni and Pd and/or Au.

Once the package (e.g., 300, 400) is fabricated, the package may be coupled to a board 106 through a plurality of interconnects 107. For example, the package (e.g., 300, 400) may be coupled to the plurality of board interconnects 162 through the plurality of interconnects 107.

Exemplary Electronic Devices

Figure 13:
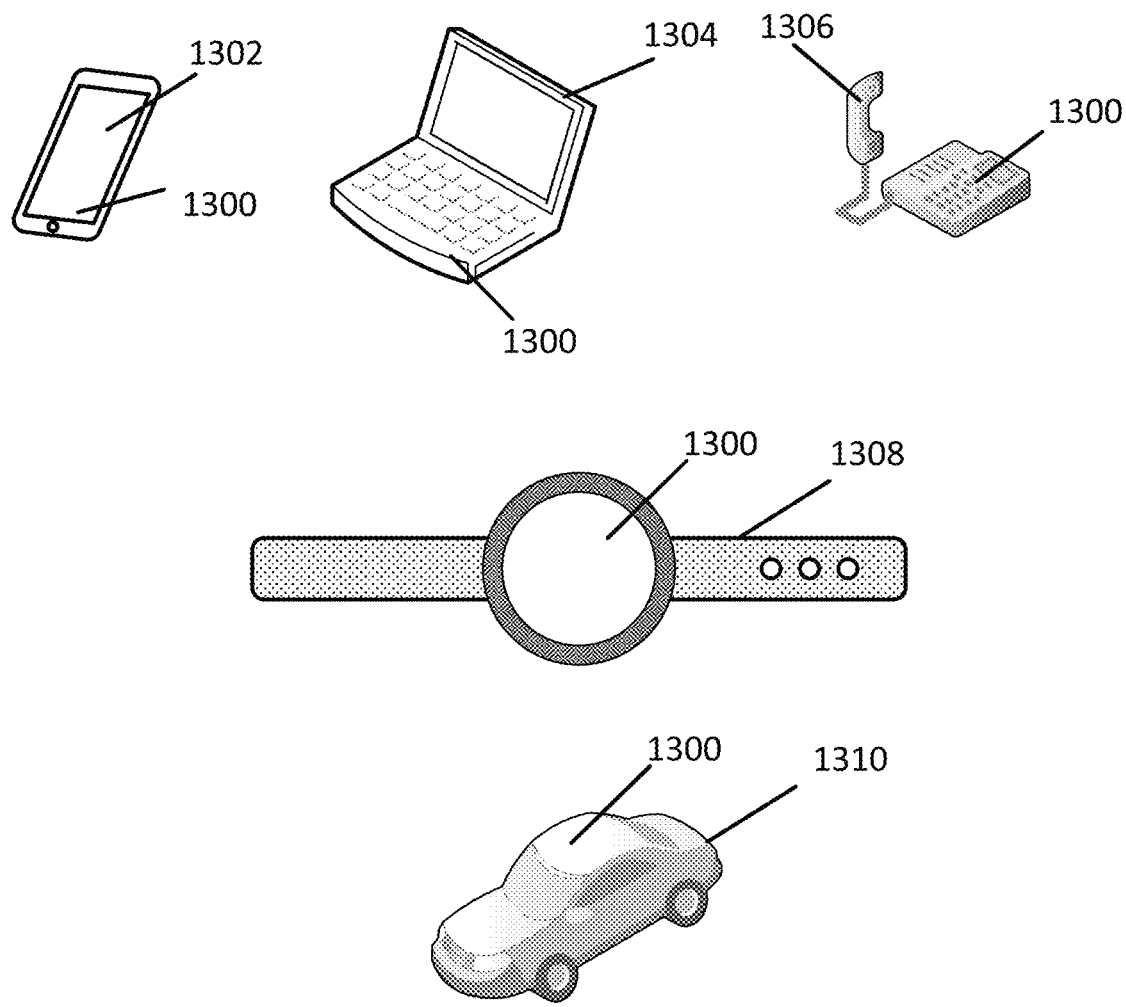
FIG. 13 illustrates various electronic devices that may integrate a die, an integrated device, an integrated passive device (IPD), a passive component, a package, and/or a device package described herein.

FIG. 13 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1302, a laptop computer device 1304, a fixed location terminal device 1306, a wearable device 1308, or automotive vehicle 1310 may include a device 1300 as described herein. The device 1300 may be, for example, any of the devices and/or integrated circuit (IC) packages described herein. The devices 1302, 1304, 1306 and 1308 and the vehicle 1310 illustrated in FIG. 13 are merely exemplary. Other electronic devices may also feature the device 1300 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-10, 11A-11F, 12A-12E, and/or 13 may be rearranged and/or combined into a single component, process, feature or function or embodied in several components, processes, or functions. Additional elements, components, processes, and/or functions may also be added without departing from the disclosure. It should also be noted FIGS. 1-10, 11A-11F, 12A-12E, and/or 13 and its corresponding description in the present disclosure is not limited to dies and/or ICs. In some implementations, FIGS. 1-10, 11A-11F, 12A-12E, and/or 13 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth"

(and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a current (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or an electro plating process or electroless plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising an acoustic device, a frame coupled to the acoustic device, a cap substrate coupled to the acoustic device through the frame, and a cavity located between the acoustic device and the cap substrate. The acoustic device comprises a substrate and an acoustic element coupled to the substrate. The cap substrate includes an inductor. The cap substrate is configured as a cap for the acoustic device.

Aspect 2: The package of aspect 1, wherein the frame includes a polymer frame.

Aspect 3: The package of aspect 1, wherein the frame comprises: a first plurality of interconnects; and a second plurality of interconnects.

Aspect 4. The package of aspect 3, wherein the first plurality of interconnects includes copper, and wherein the second plurality of interconnects includes tin and/or gold.

Aspect 5: The package of aspect 4, wherein the cap substrate is coupled to the acoustic device through copper tin copper diffusion bonding.

Aspect 6: The package of aspects 1 through 5, further comprising a metallization portion coupled to the cap substrate.

Aspect 7: The package of aspect 6, wherein the metallization portion includes a plurality of metallization interconnects.

Aspect 8: The package of aspects 1 through 7, wherein the inductor includes a solenoid inductor.

Aspect 9: The package of aspect 8, wherein a magnetic field generated by the solenoid inductor has a direction that is parallel to a surface of a passive device facing the acoustic device.

Aspect 10: The package of aspects 1 through 9, wherein the package has a thickness of about 450 micrometers or less.

Aspect 11: The package of aspects 1 through 5 and 8 through 9, wherein the package has a thickness of about 200 micrometers or less.

Aspect 12: The package of aspects 1 through 11, wherein the acoustic device includes a first coefficient of thermal expansion, wherein the cap substrate is part of a passive device coupled to the acoustic device, and wherein the passive device includes a second coefficient of thermal expansion.

Aspect 13: The package of aspect 12, wherein a difference between the second coefficient of thermal expansion and the first coefficient of thermal expansion is about 2 parts per million (ppm) or less.

Aspect 14: The package of aspects 1 through 13, wherein the acoustic device and the cap substrate are configured to allow an electrical signal from the acoustic device to travel through at least one interconnect from the cap substrate.

Aspect 15: The package of aspects 1 through 14, wherein the acoustic device is configured to operate as a surface acoustic wave (SAW) filter or a bulk acoustic wave (BAW) filter.

Aspect 16: A package comprising an acoustic device, a polymer frame coupled to the acoustic device, a cap substrate coupled to the acoustic device through the polymer frame, and a cavity located between the acoustic device and the cap substrate. The acoustic device comprises a substrate and an acoustic element coupled to the substrate. The cap substrate includes an inductor. The cap substrate is configured as a cap for the acoustic device.

Aspect 17: The package of aspect 16, wherein the cap substrate includes a plurality of first interconnects.

Aspect 18: The package of aspects 16 through 17, further comprising: a dielectric layer coupled to the cap substrate; and a plurality of second interconnects located in and over the dielectric layer.

Aspect 19: The package of aspects 16 through 18, wherein the cap substrate includes a glass, and wherein the dielectric layer includes prepreg and/or polyimide.

Aspect 20: The package of aspects 18 through 19, wherein the plurality of second interconnects includes a plurality of redistribution interconnects.

Aspect 21: The package of aspects 17 through 20, wherein at least some of the first interconnects from the plurality of first interconnects are configured to operate as the inductor.

Aspect 22: The package of aspects 16 through 21, wherein the substrate comprises a piezoelectric material.

Aspect 23: The package of aspect 22, wherein the substrate comprising the piezoelectric material includes a substrate and a piezoelectric layer formed over the substrate.

Aspect 24: The package of aspects 16 through 23, wherein the cap substrate includes a plurality of interconnects that extend through a thickness of the cap substrate, wherein the plurality of interconnects is coupled to a plurality of interconnects from the acoustic device.

Aspect 25: The package of aspect 24, wherein the plurality of first interconnects is at least partially located between the polymer frame.

Aspect 26: A package comprising an acoustic device, a cap substrate coupled to the acoustic device through a first plurality of interconnects and a second plurality of interconnects, and a cavity located between the acoustic device and the cap substrate. The acoustic device comprises a substrate and an acoustic element coupled to the substrate. The cap substrate includes an inductor. The cap substrate is configured as a cap for the acoustic device.

Aspect 27: The package of aspect 26, wherein the first plurality of interconnects includes copper, and wherein the second plurality of interconnects includes tin and/or gold.

Aspect 28: The package of aspect 27, wherein the cap substrate is coupled to the acoustic device through copper tin copper diffusion bonding.

Aspect 29: The package of aspects 26 through 28, wherein the cap substrate includes a plurality of first interconnects.

Aspect 30: The package of aspects 26 through 29, further comprising a dielectric layer coupled to the cap substrate; and a plurality of second interconnects located in and over the dielectric layer.

Aspect 31: The package of aspects 26 through 30, wherein the cap substrate includes a glass, and wherein the dielectric layer includes prepreg and/or polyimide.

Aspect 32: The package of aspect 30, wherein the plurality of second interconnects includes a plurality of redistribution interconnects.

Aspect 33: The package of aspects 29 through 32, wherein at least some of the first interconnects from the plurality of first interconnects are configured to operate as the inductor.

Aspect 34: The package of aspects 26 through 33, wherein the cavity is located between the acoustic element and the cap substrate.

Aspect 35: The package of aspects 26 through 34, wherein the first plurality of interconnects and the second plurality of interconnects are configured as a frame for the package.

Aspect 36: An apparatus comprising an acoustic device, means for a frame coupled to the acoustic device, a cap substrate coupled to the acoustic device through the means for a frame, and a cavity located between the acoustic device and the cap substrate. The acoustic device comprises a substrate and an acoustic element coupled to the substrate. The cap substrate includes an inductor. The cap substrate is configured as a cap for the acoustic device.

Aspect 37: The package of aspect 36, wherein the means for a frame includes a polymer frame.

Aspect 38: The apparatus of aspect 36, wherein the means for a frame comprises: a first plurality of interconnects; and a second plurality of interconnects.

Aspect 39. The apparatus of aspect 38, wherein the first plurality of interconnects includes copper, and wherein the second plurality of interconnects includes tin and/or gold.

Aspect 40: The apparatus of aspect 39, wherein the cap substrate is coupled to the acoustic device through copper tin copper diffusion bonding.

Aspect 41: The apparatus of aspects 36 through 40, further comprising a metallization portion coupled to the cap substrate.

Aspect 42: The apparatus of aspects 36 through 41, wherein the inductor includes a solenoid inductor.

Aspect 43: The apparatus of aspect 42, wherein a magnetic field generated by the solenoid inductor has a direction that is parallel to the surface of a passive device facing the acoustic device.

Aspect 44: The apparatus of aspects 36 through 43, wherein the acoustic device and the cap substrate are configured to allow an electrical signal from the acoustic device to travel through at least one interconnect from the cap substrate.

Aspect 45: The apparatus of aspects 36 through 44, wherein the acoustic device is configured to operate as a surface acoustic wave (SAW) filter or a bulk acoustic wave (BAW) filter.

Aspect 46: A method for fabricating a package. The method provides an acoustic device. The method couples a cap substrate to the acoustic device through a frame. The cap substrate is coupled to the frame such that a cavity is located between the acoustic device and the cap substrate. The acoustic device comprises a substrate and an acoustic element coupled to the substrate. The cap substrate includes an inductor. The cap substrate is configured as a cap for the acoustic device.

Aspect 47: The method of aspect 46, wherein the frame includes a polymer frame.

Aspect 48: The method of aspect 46, wherein the frame comprises: a first plurality of interconnects; and a second plurality of interconnects.

Aspect 49. The method of aspect 48, wherein the first plurality of interconnects includes copper, and wherein the second plurality of interconnects includes tin and/or gold.

Aspect 50: The method of aspect 49, wherein the cap substrate is coupled to the acoustic device through copper tin copper diffusion bonding of the first plurality of interconnects, the second plurality of interconnects and interconnects of the acoustic device.

Aspect 51: The method of aspects 46 through 50, further comprising forming a metallization portion over the cap substrate.

Aspect 52: The method of aspect 51, wherein forming the metallization portion includes providing at least one dielectric layer and forming a plurality of metallization interconnects.

Aspect 53: The method of aspects 46 through 52, wherein the acoustic device and the cap substrate are configured to allow an electrical signal from the acoustic device to travel through at least one interconnect from the cap substrate.

Aspect 54: The method of aspects 46 through 53, wherein the acoustic device is configured to operate as a surface acoustic wave (SAW) filter or a bulk acoustic wave (BAW) filter.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the aspects. As such, the present teachings can be readily applied to other types of apparatuses and many alternatives, modifications, and variations will be apparent to those skilled in the art.

The invention claimed is:

1. A package comprising:
an acoustic device comprising:
a substrate; and
an acoustic element coupled to the substrate;
a frame coupled to the acoustic device;
a cap substrate coupled to the acoustic device through the frame,
wherein the cap substrate is a single glass layer comprising a first surface and a second surface, wherein the second surface is opposite to the first surface,
wherein the cap substrate includes an inductor defined by a plurality of inductor interconnects,
wherein a first set of inductor interconnects from the plurality of inductor interconnects are located at least partially in the single glass layer,
wherein a second set of inductor interconnects from the plurality of inductor interconnects are located on the first surface of the single glass layer,
wherein a third set of inductor interconnects from the plurality of inductor interconnects are located on the second surface of the single glass layer, and
wherein the cap substrate is configured as a cap for the acoustic device,
a first plurality of interconnects comprising one or more interconnects that extend through (i) the entire thickness of the cap substrate and (ii) the frame, to a surface of the substrate, wherein a side wall of the one or more interconnect that touches the frame has a vertical curve; and
a cavity located between the acoustic device and the first surface of the cap substrate, wherein at least part of the first set of inductor interconnects is exposed to the cavity.

2. The package of claim 1, wherein the frame includes a polymer frame.

3. The package of claim 1, further comprising a metallization portion coupled to the cap substrate.

4. The package of claim 3, wherein the metallization portion includes a plurality of metallization interconnects.

5. The package of claim 1, wherein the inductor includes a solenoid inductor.

6. The package of claim 5, wherein a magnetic field generated by the solenoid inductor has a direction that is parallel to a surface of a passive device facing the acoustic device.

7. The package of claim 1, wherein the package has a thickness of about 450 micrometers or less.

8. The package of claim 1, wherein the package has a thickness of about 200 micrometers or less.

9. The package of claim 1,
wherein the acoustic device includes a first coefficient of thermal expansion,
wherein the cap substrate is part of a passive device coupled to the acoustic device, and
wherein the passive device includes a second coefficient of thermal expansion.

10. The package of claim 9, wherein a difference between the second coefficient of thermal expansion and the first coefficient of thermal expansion is about 2 parts per million (ppm) or less.

11. The package of claim 1, wherein the acoustic device and the cap substrate are configured to allow an electrical signal from the acoustic device to travel through one or more interconnects from the cap substrate.

12. The package of claim 1, wherein the acoustic device is configured to operate as a surface acoustic wave (SAW) filter or a bulk acoustic wave (BAW) filter.

13. A package comprising:
an acoustic device comprising:
a substrate; and
an acoustic element coupled to the substrate;
a polymer frame coupled to the acoustic device;
a cap substrate coupled to the acoustic device through the polymer frame,
wherein the cap substrate includes an inductor defined by a plurality of inductor interconnects, and
wherein the cap substrate is configured as a cap for the acoustic device,
a first plurality of interconnects comprising an interconnect that extends through (i) an entire single glass layer of the cap substrate and (ii) the polymer frame, wherein a side wall of the interconnect that touches the polymer frame has a vertical curve; and
a cavity located between the acoustic device and the cap substrate, wherein at least part of the plurality of inductor interconnects is exposed to the cavity.

14. The package of claim 13, further comprising:
a dielectric layer coupled to the cap substrate; and
a second plurality of interconnects located in and over the dielectric layer.

15. The package of claim 14,
wherein the dielectric layer includes prepreg and/or polyimide.

16. The package of claim 14, wherein the plurality of the second interconnects includes a plurality of redistribution interconnects.

17. The package of claim 13, wherein the substrate comprises a piezoelectric material.

18. The package of claim 17, wherein the substrate comprising the piezoelectric material includes a substrate and a piezoelectric layer formed over the substrate.

19. The package of claim 13, wherein the first plurality of interconnects is at least partially located in the polymer frame.

* * * * *